(12) United States Patent
Debije et al.

(10) Patent No.: US 8,969,715 B2
(45) Date of Patent: Mar. 3, 2015

(54) LUMINESCENT OPTICAL DEVICE AND SOLAR CELL SYSTEM WITH SUCH LUMINESCENT OPTICAL DEVICE

(75) Inventors: Michael George Debije, Eindhoven (NL); Casper Laurens Van Oosten, Utrecht (NL); Cornelis Wilhelmus Maria Bastiaansen, Montfort (NL); Shufen Tsoi, Weert (NL)

(73) Assignee: Peer+ B.V., Eindhoven (NL)

( * ) Notice: Subject to any disclaimer, the term of this patent is extended or adjusted under 35 U.S.C. 154(b) by 12 days.

(21) Appl. No.: 13/387,380

(22) PCT Filed: Jul. 23, 2010

(86) PCT No.: PCT/EP2010/060701
§ 371 (c)(1),
(2), (4) Date: Jan. 27, 2012

(87) PCT Pub. No.: WO2011/012545
PCT Pub. Date: Feb. 3, 2011

(65) Prior Publication Data
US 2012/0118381 A1    May 17, 2012

(30) Foreign Application Priority Data

Jul. 31, 2009  (EP) .................................. 09166921
Feb. 25, 2010  (EP) .................................. 10154665

(51) Int. Cl.
*H01L 31/0232* (2014.01)
*F21V 8/00* (2006.01)
*H01L 31/052* (2014.01)
*H01L 31/055* (2014.01)

(52) U.S. Cl.
CPC ............ *H01L 31/0522* (2013.01); *G02B 6/004* (2013.01); *G02B 6/0053* (2013.01); *G02B 6/0058* (2013.01); *H01L 31/055* (2013.01); *Y02E 10/52* (2013.01)

USPC ............ 136/257; 136/247; 136/259; 362/629

(58) Field of Classification Search
CPC ......................... H01L 31/0522; H01L 31/055
USPC .................................. 136/259, 254, 257, 247
See application file for complete search history.

(56) References Cited

U.S. PATENT DOCUMENTS

| 4,153,813 A | 5/1979 | Blieden et al. |
|---|---|---|
| 4,188,238 A | 2/1980 | Boling |

(Continued)

FOREIGN PATENT DOCUMENTS

| DE | 3803246 A1 | 8/1989 | |
|---|---|---|---|
| EP | 2139048 A1 | 12/2009 | |
| WO | WO2006088369 | * 8/2006 | ..................... 136/259 |

*Primary Examiner* — Jonathan Johnson
*Assistant Examiner* — Bethany L Martin
(74) *Attorney, Agent, or Firm* — Oliff PLC

(57) ABSTRACT

The invention provides a luminescent optical device (10) having an optical waveguide (200). The luminescent optical device (10) further has a photo-luminescent structure (100) on or inside the optical waveguide (200). The photo-luminescent structure (100) comprises a plurality of photo-luminescent domains (110) containing photo-luminescent material (120). The photo-luminescent material (120) is capable of emitting emission light upon excitation by excitation light. The photo-luminescent domains (110) are arranged to emit, upon excitation by excitation light, at least part of the emission light into the optical waveguide layer (200). The luminescent optical device (10) further may comprise a lens structure (300) on the optical waveguide (200). The lens structure (300) comprises a plurality of lenses (310), arranged to capture incident light provided from an external light source, in particular the sun, and to concentrate the incident light onto the plurality of photo-luminescent domains (110) as excitation light for excitation of the photo-luminescent material (120).

12 Claims, 13 Drawing Sheets

(56) References Cited

U.S. PATENT DOCUMENTS

| | | |
|---|---|---|
| 4,199,376 A | 4/1980 | Sill |
| 4,238,247 A | 12/1980 | Oster, Jr. |
| 4,251,284 A | 2/1981 | Oster, Jr. |
| 2009/0044861 A1* | 2/2009 | Debije et al. ............ 136/259 |
| 2009/0067784 A1* | 3/2009 | Ghosh et al. ............ 385/33 |
| 2009/0100727 A1 | 4/2009 | Chen |
| 2009/0126778 A1 | 5/2009 | Brounne et al. |
| 2010/0043875 A1* | 2/2010 | Bhaumik et al. ............ 136/256 |
| 2012/0138124 A1* | 6/2012 | Shmueli et al. ............ 136/247 |

* cited by examiner

Fig 1
*prior art*
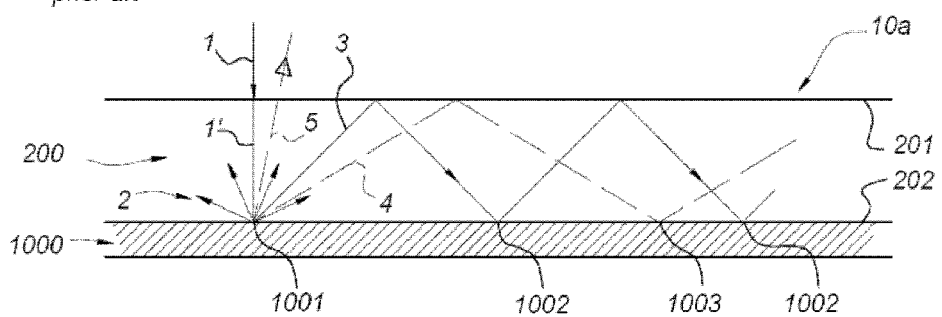
Fig. 2
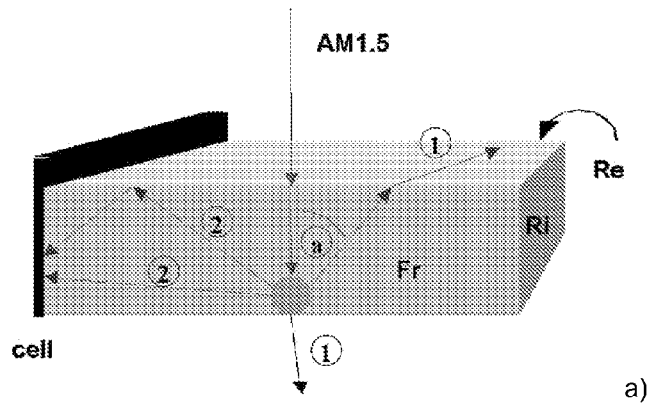
a)
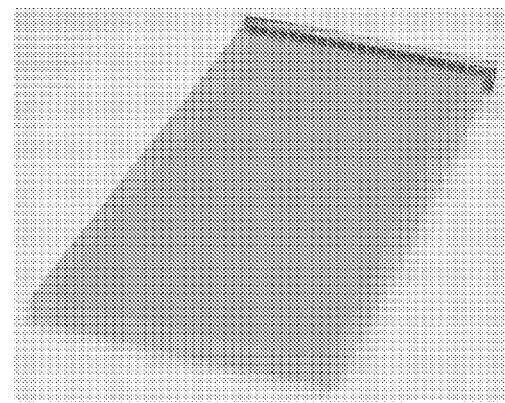
b)

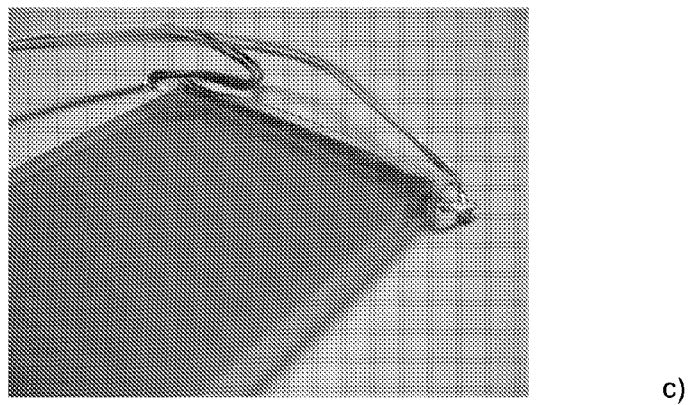
c)
Fig. 2 (prior art)
*Fig 3*
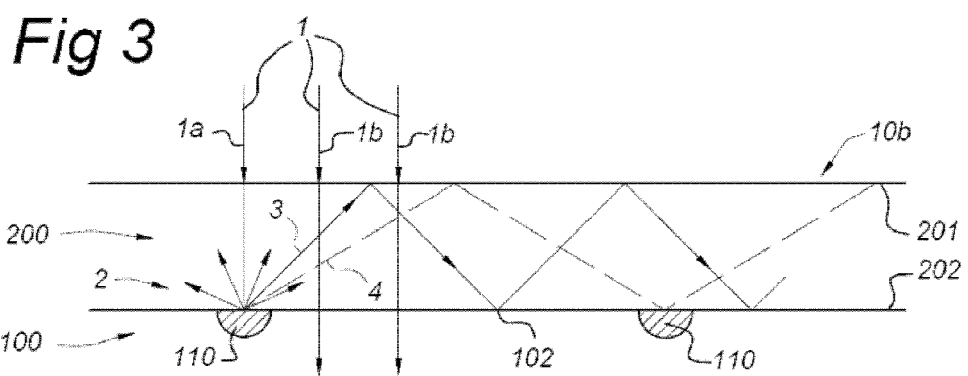
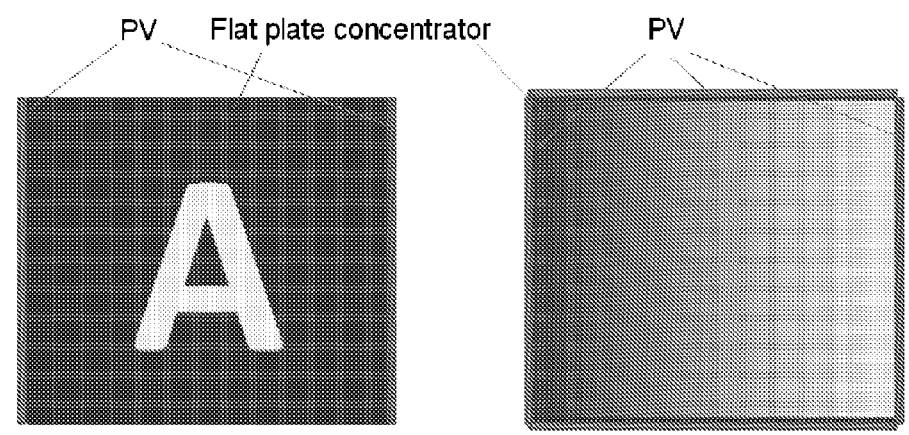
Fig. 4

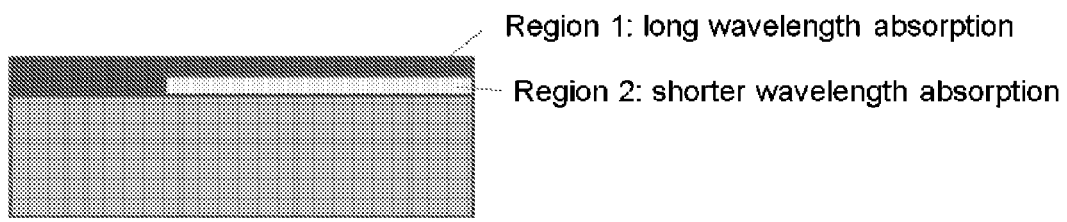
Fig 14a
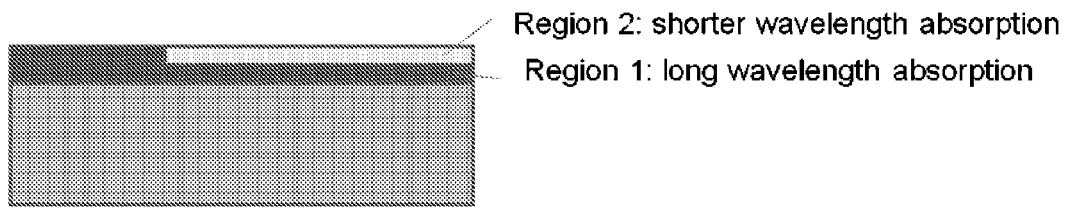
Fig 14b
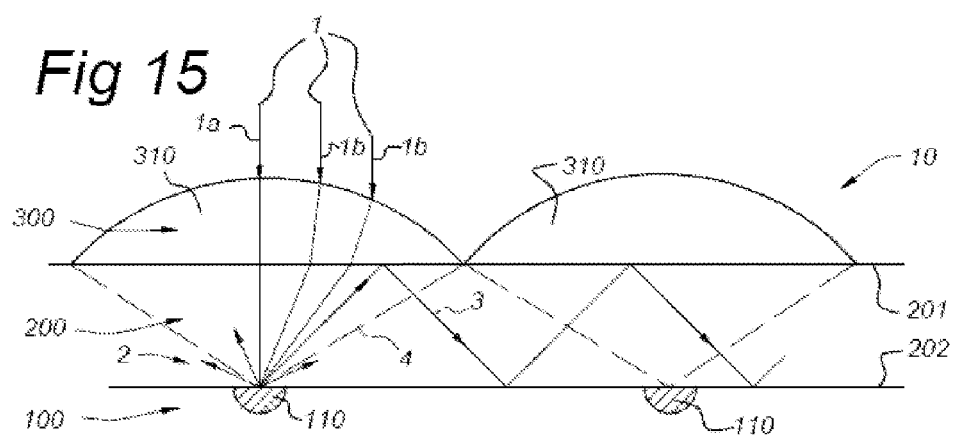

LUMINESCENT OPTICAL DEVICE AND SOLAR CELL SYSTEM WITH SUCH LUMINESCENT OPTICAL DEVICE

FIELD OF THE INVENTION

The invention relates to a luminescent optical device, more particularly to a luminescent solar concentrator (LSC), and a solar cell system with such luminescent optical device.

BACKGROUND OF THE INVENTION

The cost of generating solar energy per unit Watt in a photovoltaic system is several times higher than generating energy from other sources, which include coal, oil, wind, biomass and nuclear energy. In order to reduce the cost of solar energy generation in photovoltaic systems, it is desirable to make efficient use of the most expensive part of the system, namely the photovoltaic cell (herein also referred to as the solar cell). Conventionally, this is done by using large light-focusing parabolic mirrors or large Fresnel lenses, with the photovoltaic cell positioned in the focal point of the parabolic mirror or Fresnel lens. These devices have several disadvantages, including high investment cost, high maintenance cost, unwieldy shapes, and the necessity of tracking the sun as it crosses the sky, requiring mechanical constructions to physically alter the orientation of the device, the mirrors, lenses and/or the photovoltaic cell (PV cell). Photovoltaic systems have thus been the subject of many recent investigations, in particular to provide cost-effective and efficient alternatives allowing concentration of incident light collected over a large area to a small area.

Luminescent solar concentrators (LSC) represent an alternative that has been the subject of investigations, predominantly because these systems are easy to produce at low cost and because these systems do not require tracking of the sun. Luminescent solar concentrators are known in the art and usually consist of a flat plate which acts as a waveguide, usually plastic, either filled with a single fluorescent dye, phosphor and/or quantum dot or a plurality of these materials in a uniform mixture, or with these luminophore(s) in a thin layer (<100 microns) on the top or bottom of the waveguide. The luminescent material absorbs light of specific wavelengths from the solar light incident upon it, and re-emits the light in all directions at longer wavelengths. A portion of this light is emitted outside the critical angle of a supporting waveguide, and is totally internally reflected and transported to the photovoltaic cell, typically positioned at one or more ends of the waveguide for conversion of the emitted light to electricity. In this way, luminescent solar concentrators concentrate sunlight to a particular spot or area, where the concentrated solar energy can then be converted by a PV solar cell. This not only increases efficiency, but also decreases cost, as luminescent solar concentrator panels can be made cheaply from plastics, while PV-cells need to be completely constructed from expensive materials such as purified silicon. The LSC has the advantage of combining less expensive materials with flexibility (especially when a plastic waveguide is used) without the need of a heat sink or a sun tracking system. At the moment, LSC-systems are not used commercially which is predominantly related to their relatively poor efficiency. This low overall efficiency originates from a high re-absorption of emitted light (limited Stokes Shift of the dye), from a poor efficiency of coupling light into the waveguide and from a poor efficiency in keeping the light within the waveguide.

An example of an alternative LSC system is described in European Patent EP 1 854 151 B1. EP 1 854 151 describes, amongst others, a laminate of a planar waveguide with a luminescent layer, arranged to receive incident sun light over a full face of the laminate, to excite the luminescent layer with the incident sun light, upon which the luminescent layer emits emission light into the waveguide, and to transport the emission light through the waveguide to an exit surface of the waveguide, where it is delivered to a PV cell. This may allow the use of small-sized PV cell(s), as the waveguide may have a small exit surface(s), while it may have a large light collection surface, as the waveguide may have a large area. The known laminate may be advantageous over alternative known systems as it provides a thin, potentially light-weight and potentially allows roll-to-roll manufacturing. However, the known laminate may have the disadvantage that the emission light may be reabsorbed by the luminescent layer when propagating through the waveguide, or be lost upon scattering by the luminescent layer. Although part of the reabsorbed light may be re-emitted by the luminescent layer, the associated losses may be significant, especially when the waveguide has a large area and is thin, and the propagating emission light is interacting multiple times with the luminescent layer. Another disadvantage may be that the relative area between waveguide and size of the PV cell may be limited, due to these propagation losses.

Further, luminescent solar concentrators are solar energy collectors that are well suited for integration into existing products such as buildings, sign-boards, and similar objects. However, in many of these applications, the appearance of the system is as important, or even more important, than its functionality. For an acceptable appearance, it is often desirable to have a luminescent solar concentrator that displays multiple colors, with the colors in specific regions and visible as separate colors.

Traditionally, additional colors are being applied to LSC's using non-luminescent dyes. The technology to do so is widely available and the patterning of the dye on the substrate is easily implemented using offset printing, flexoprinting, painting, or other techniques. However, in the case of an LSC, patterning of a non-luminescent dye on an LSC dramatically decreases the output of the solar energy collection.

There is thus a desire for an alternative thin and efficient solar energy system, and components therefore. In particular, there is a desire to provide a luminescent optical device as a light concentrator therefore in the form of a thin, light-weight structure, in particular in the form a sheet or a laminate of a plurality of layers. It is another desire to provide a potentially cheap and robust device. It is another desire to provide a device which may be economically manufactured in a variety of sizes, e.g. in a roll-to-roll process, and/or be suitable for mass-scale manufacturing.

It is a further object of this invention to provide a luminescent solar collector that provides the desired appearance for certain applications without negatively affecting the electrical output.

Hence, it is an aim of the invention to provide an alternative luminescent optical device, which preferably further at least partly obviates one or more of the above-described or other drawbacks associated with the prior art, and which further preferably fulfils one or more of the above indicated desires. In particular, the invention aims to provide a luminescent optical device with an increased efficiency with which emitted light is transported through the waveguide.

In another aspect, the invention aims to provide an alternative solar cell system, which preferably further at least partly obviates one or more of above-described drawbacks, and which further preferably fulfils one or more of the above indicated desires.

SUMMARY OF THE INVENTION

Hereto, the invention provides, in a first aspect, a luminescent optical device comprising:

a. an optical waveguide,
b. a photo-luminescent structure on or inside the optical waveguide, the photo-luminescent structure comprising a plurality of photo-luminescent domains containing photo-luminescent material, the photo-luminescent material being capable of emitting emission light upon excitation by excitation light, and the photo-luminescent domains being arranged to emit, upon excitation by excitation light, at least part of the emission light into the optical waveguide layer.

One object of the present invention thus is being achieved by an optical device as described in the opening paragraph wherein the concentrations of the luminescent dye(s) are varied with respect to each other in the plane of the waveguide and/or into separate physical regions so as to produce recognizable differences in colors or intensity.

Traditional LSC's are optimized for the highest output and are therefore only single color devices have been produced. Examples of LSC's can be found in Van Sark et al. in OPTICS EXPRESS, December 2008, Vol. 16, No. 26, 2177322, or R. Kinderman et al. in Journal of Solar Energy Engineering, AUGUST 2007, Vol. 129, 277-282.

There are examples of LSCs in the prior art containing multiple dyes, but these are not divided into regions, but are a uniform mixture that results in a device of a single color resulting from the summation of colors of the component dyes, and individual dye colors are not distinguishable (Bailey et al, Sol. Energ. Mater. Sol. C. 91 (2007) 67). To date, no LSCs with dyes in specific regions as multiple patterned dyes have been demonstrated.

This invention improves the output of patterned LSC systems by using patterned luminescent dyes that are varied in concentration in the plane of the LSC. In this way the output of the LSC is high while still allowing decoration, illustration or communication (signs) of the LSC. The luminescent dyes can be varied in concentration by offset printing, flexoprinting, painting, or other techniques. A combination of LSC's with patterned dyes is neither known nor obvious.

The inventive device also allows the production of patterns that display a colored image of an object that is capable of generating electrical power.

Traditionally, LSC's have been designed for optimal performance in terms of electrical output. In that view, it is surprising that to change the concentration of dyes in the plane of the LSC will give not only the desired signage but still electricity in high efficiency. Traditionally, signage is designed to be visible upon illumination, or uses integrated light fixtures to emit the desired visual information. The current invention additionally generates electricity, and can emit visual information independent of an additional light source, neither of which is obvious.

This is a simple to implement and effective solution.

The LSC designed in this way would have advantages over normal signage in that the LSC sign is capable of generating electrical current from solar energy, whereas the normal signage does not. At the same time, the LSC sign generates electricity, whereas a normal sign does not or needs a device attached to it to do so. In the LSC this is integrated into a simple and robust device, which makes it cost effective and potentially autonomous.

Hereto, the invention provides, in a second aspect, a luminescent optical device comprising:

a. an optical waveguide,
b. a photo-luminescent structure on or inside the optical waveguide, the photo-luminescent structure comprising a plurality of photo-luminescent domains containing photo-luminescent material, the photo-luminescent material being capable of emitting emission light upon excitation by excitation light, and the photo-luminescent domains being arranged to emit, upon excitation by excitation light, at least part of the emission light into the optical waveguide layer; and
c. a lens structure on the optical waveguide, the lens structure comprising a plurality of lenses, and the plurality of lenses being arranged to capture incident light provided from an external light source and to concentrate the incident light onto the plurality of photo-luminescent domains as excitation light for excitation of the photo-luminescent material.

The luminescent optical device is capable of efficiently collecting incident light, providing a spectral fraction of it as excitation light to the luminescent domains, efficiently converting the excitation light into emission light, and efficiently transporting the excitation light by the waveguide to an end or ends of the waveguide, where it may e.g. be provided to photovoltaic cell(s).

The lens structure advantageously collects a major fraction, preferably substantially all, incident light and concentrates the major fraction, preferably substantially all, incident light to the photo-luminescent material. Arranging the photo-luminescent material in luminescent domains, instead of as a continuous layer, may reduce the re-absorption and/or other losses while the emission light is transported through the waveguide while being totally internally reflected at both surfaces of the waveguide. As the photo-luminescent structure is provided on or inside the optical waveguide, thus at fixed positions, an efficient coupling of emission light emitted from the luminescent material into the waveguide may be provided. Furthermore, as also the lens structure is provided on the optical waveguide, a robust and versatile luminescent optical device may be provided, essentially without any moving mechanical components. Moreover, as the components of the luminescent optical device (waveguide, photo-luminescent structure with photo-luminescent domains and lens structure with lenses) may be aligned and fixed in position during manufacturing of the luminescent optical device, there is no need for any further alignment of these components relative to each other when installing the luminescent optical device, nor during use. Finally, the lens structure may be in good optical contact with the waveguide, so that a well-defined optical interface surface may be provided over the full interface between the lens structure and the waveguide.

The term "incident light" relates to light incident on the optical device, originating from an external light source, in particular sunlight from the sun. The term "domains" relates to regions on or inside the waveguide. Adjacent domains are thus separated by a change in composition and/or a change in thickness of the luminescent material. The domains may be separate, isolated regions or may have a gradient in concentration or thickness separating one from the other. "Domains" may also be referred to as "islands". In the following, the "luminescent optical device" may also be referred to as an "optical device", or as a "luminescent object.", and the term "photo-luminescent" may also be referred to as "luminescent".

The optical waveguide may also be referred to as a "waveguide". The waveguide may have an entrance surface extending along the length of the waveguide and an exit surface at an end or ends of the waveguide, the emission light being at least partly transported by the waveguide to the exit surface(s). The entrance surface may in particular be larger than the exit surface(s), for concentrating incident light incident on a large area to a small-sized area(s). Thus, the optical waveguide layer may be arranged to guide (using total internal reflection) the emission light to a waveguide exit surface(s) with an exit area(s), the exit area(s) being substantially smaller than an incident light receiving area, thereby effectively concentrating the incident light from a large area onto a small exit area(s), where e.g. a small photovoltaic cell(s) may be positioned to receive the emission light.

The photo-luminescent structure with the luminescent domains may be positioned on the optical waveguide, e.g. on the entrance surface or on the opposite surface. In embodiments the optical waveguide has embossments at its surface wherein the photo-luminescent domains are at least partly provided. In other embodiments the photo-luminescent structure is positioned inside the optical waveguide, e.g. as a plane of photo-luminescent domains, arranged substantially parallel to the waveguide surface(s).

The lens structure may be provided on the optical waveguide as an optical component manufactured independently of the waveguide and subsequently attached to the waveguide. The lens structure may include a contacting layer for contacting (e.g. laminating) the lens structure to the waveguide and/or additional optical layers, such as a low-n layer (wherein n is the refractive index of the layer material) or a wavelength selective layer, at its surface facing the waveguide, and/or at its surface where light is incident. The lens structure may alternatively be formed on top of the waveguide during manufacturing of the optical waveguide. For instance, the lens structure may be provided on the optical waveguide as an integral part of the waveguide. In embodiments of the invention the lens structure is formed as a shaped surface of the waveguide.

As will be clear to the person skilled in the art, embodiments of the invention presented herein may be combined.

In an embodiment, each lens of the plurality of lenses is arranged to concentrate incident light onto a corresponding photo-luminescent domain of the plurality of photo-luminescent domains. The plurality of lenses is thus equal to the plurality of photo-luminescent domains, wherein each lens is associated with a single corresponding photo-luminescent domain. Hence, each lens is associated with one photo-luminescent domain, and arranged to concentrate incident light onto the associated photo-luminescent domain. This allows for efficient concentration and capturing of the incident light.

In an alternative embodiment, the plurality of lenses are arranged in a plurality of lens arrays, wherein each lens array comprises a subset of the plurality of lenses, and wherein the plurality of lens arrays is equal to the plurality of photo-luminescent domains, and each lens array of the plurality of lens arrays is arranged to concentrate incident light onto a corresponding photo-luminescent domain of the plurality of photo-luminescent domains. The plurality of lens arrays is thus equal to the plurality of photo-luminescent domains, wherein lens array is associated with a single corresponding photo-luminescent domain. Such lens array may e.g. comprise a plurality of rows of, e.g. circular, lenses, wherein the lenses are arranged side-by-side on a respective row, and wherein each row of lenses is arranged to concentrate incident light onto a corresponding, line-shaped, photo-luminescent domain. The corresponding, line-shaped, photo-luminescent domain may in particular be aligned with the corresponding row of lenses. This may allow for efficient concentration and capturing of the incident light. As the number of luminescent domains may be significantly smaller than the number of lenses, this may further be advantageous in manufacturing the photo-luminescent structure compared to embodiments wherein a large number of relatively small luminescent domains have to be manufactured.

In an embodiment, the plurality of lenses is provided in a lens plane, the lens plane being arranged substantially parallel to the waveguide. The plurality of lenses is preferably arranged in a one- or two-dimensional array. Thus, the lenses are arranged side-by-side in the lens plane. The lens structure may e.g. be provided as an embossed foil, wherein the embossments are shaped to form the lenses. The luminescent optical device may thus be provided as e.g. a laminate of the lens structure with the lenses on the waveguide.

In an embodiment the lenses are designed to capture and concentrate incident light on one or more associated photo-luminescent domains for incident light that is incident onto a top surface of the luminescent optical device within an angular acceptance range ($\phi_T$) of at least 40°, preferably at least 60°, even more preferably at least 120°. The angular range may e.g. correspond to a range of $\phi = -20°$ to $\phi_2 = +20°$, preferably larger than $-30°$ to $+30°$, even more preferably larger than $-60°$ to $+60°$, relative to a normal to the top surface of the optical device. The luminescent optical device may thus be used without any accurate angular alignment relative to the direction of the incident light; a rough angular alignment may already be sufficient for the luminescent optical device to function efficiently. The angular acceptance range that is accommodated by the luminescent optical device may thus efficiently receive sun light over a large fraction of the day, as the relatively large angular acceptance range may not require any tracking of the sun's trajectory along the sky during the day, nor may it require adjustments depending on the season.

In an embodiment the lenses are aspherical lenses having an aspherical cross-section. Herein, the term "aspherical lens" refers to a lens of which at least one surface has a profile that is neither a portion of a sphere nor of a circular cylinder, and the term "aspherical cross section" refers to a cross-section that is not a portion of a circular dish. Herein, the cross-section is defined in a plane comprising the optical axis of the lens, which is in particular substantially perpendicular to a normal of the front surface of the luminescent optical device and/or a normal to the upper surface of the waveguide and/or a normal to the lower surface of the waveguide. The aspherical cross-section of the lenses may be particularly suitable for accommodating a large angular acceptance range. The aspherical cross section may e.g. be a cross-section that has a profile that can be parameterized according to a formula:

$$z = \frac{Cr^2}{1 + \sqrt{1 - (1+K)C^2 r^2}} + \sum_{n=2}^{10} A_{2n} r^{2n}$$

wherein:
r may be referred to as a radial position and corresponds to a distance in the lens plane relative to the center of the lens, which is in between $-R$ and $+R$, with R corresponding to the radial size of the lens;
z corresponds to a thickness of the lens as a function of the radial position;
n is an integer running from 2 to 10;

C corresponds to the curvature of a front surface of the lens and C has a non-zero, positive value;

K may be referred to as a conic constant and has a non-zero value;

$A_{2n}$ may be referred to as a plurality of polynomial coefficients; and wherein r has a maximum value corresponding to a radial size of the lens in the range of 25 µm to 5 cm, and z has a maximum value corresponding to a height H of the lens in the range of 0.5 µm to 1 cm.

It will be appreciated that, when the lens is a circular aspherical lens, r refers to a position relative to optical axis of the lens. When the lens is a cylindrical lens, r refers to a position relative to the a normal plane, comprising the optical axis of the lens and extending along the long axis of the lens In an embodiment, the lenses are substantially circular lenses. The circular lenses are preferably arranged side-by-side in a one-dimensional or two-dimensional array, such as using a square or hexagonal tiling, thereby substantially covering the full area of the waveguide and arranged to capture the light over substantially the full area. Circular lenses are particularly advantageous when using dot-shaped luminescent domains. Circular lenses are preferably aspherical in cross-sections in any direction to accommodate a large angular acceptance range in all directions, and preferably rotationally symmetrical around its optical axis.

In an embodiment, the lenses are substantially cylindrical lenses. The cylindrical lenses are preferably arranged side-by-side in a one-dimensional array, thereby substantially covering the full area of the waveguide and arranged to capture the light over substantially the full area. Cylindrical lenses are particularly advantageous when using line-shaped luminescent domains, but may also be used with dot-shaped luminescent domains which are relatively closely separated along the direction of the cylindrical lens and relatively widely spaced perpendicular to that direction. Cylindrical lenses are preferably aspherical in the cross-section along its short axis, to accommodate a large angular acceptance range in the corresponding direction. Use of line-shaped luminescent domains with these cylindrical lenses may advantageously also accommodate a relatively large angular acceptance range in a plane parallel to the line-shaped luminescent domains.

In an embodiment, the photo-luminescent domains are provided at an external surface of the optical waveguide. The luminescent optical device may thus be easily manufactured, as a—e.g. clear-optical waveguide may be used on which the photo-luminescent domains may be applied using a wide variety of suitable techniques, such as printing, in particular inkjet printing, photoembossing, etc. The photo-luminescent domains may be covered with a protective layer, and/or with further optical layers, such as a low-refractive index layer or a wavelength-selective mirror for enhancing the amount of emission light coupled into the waveguide. The external surface may be a top surface of the waveguide, corresponding to the surface facing the lens structure. Alternatively, the external surface may be a bottom surface, corresponding to the opposite surface of the waveguide.

In an embodiment, the photo-luminescent domains are embedded in the optical waveguide. The term "embedded" may in particular relate to the luminescent domains being fully surrounded by the waveguide. Preferably, the luminescent domains are arranged side-by-side in a plane extending through the waveguide parallel to the waveguide surface(s), e.g. at substantially the middle of the waveguide. Such arrangement may be advantageous in that emission light emitted in the forward as well as backward direction may be easily coupled into the waveguide.

In an embodiment, the optical waveguide is shaped so as to form the plurality of lenses of the lens structure. The optical waveguide and the lens structure thus form an integrated optical element without any optical interface in between the waveguide and the lens structure, which may e.g. be advantageous in reducing scattering losses at optical interfaces and which may simplify the manufacturing of the devices.

In a preferred embodiment, the luminescent optical device comprises a laminate of the optical waveguide and the lens structure. The waveguide and—independently manufactured-lens structure may thus be provided with a good optical contact over their full interface surface. Moreover, the laminate may be particularly robust, and may allow an easy handling when e.g. installing the luminescent optical device or any solar cell system with such luminescent optical device.

In an embodiment, the lens structure comprises a low-refractive index layer, wherein the low-refractive index layer has a refractive index smaller than the optical waveguide. The low-refractive index layer may be on top of the lens structure, i.e. at its surface from which the incident light enters, or, preferably, in between the optical waveguide and the lenses. The term "low-refractive index layer" relates to a layer with a refractive index that is smaller than the refractive index of the adjacent layer, in particular the waveguide. The low-refractive index layer may advantageously increase the amount of emission light that is coupled into the waveguide to be guided along the waveguide substantially with total internal reflection at the interface between the waveguide and the low-refractive index layer, and/or be reintroduced in the waveguide when escaping from it to be further guided along the waveguide. The low-refractive index layer may alternatively, or additionally, be provided at the lower surface of the waveguide.

In an embodiment, the lens structure comprises a wavelength selective mirror, wherein the wavelength-selective mirror layer is at least partially transparent for the light from the external light source, preferably at least 75% transmissive, more preferably at least 90% transmissive, and wherein the wavelength-selective mirror layer is at least partially reflective for emission light, preferably at least 50% reflective, more preferably at least 75% reflective, even more preferably at least 90%, and wherein the wavelength-selective mirror layer is arranged to transmit at least part of the light from the external light source and to reflect at least part from the emission light into the optical waveguide. The wavelength-selective mirror layer may be on top of the lens structure, i.e. at its surface from which the incident light enters, or, preferably, in between the optical waveguide and the lenses. The wavelength-selective mirror layer may alternatively, or additionally, be provided at the lower surface of the waveguide. The wavelength-selective mirror layer may advantageously increase the amount of emission light that is reintroduced in the waveguide when escaping from it to be further guided along the waveguide. Moreover, the wavelength-selective mirror layer substantially maintains the amount of incident light that is being concentrated onto the luminescent domains. The wavelength-selective mirror layer may comprise one or more chiral nematic (cholesteric) layers. The range of wavelengths over which the wavelength-selective mirror layer is transmissive (measured at normal incidence) may be referred to as the transmission band. The range of wavelengths over which the wavelength-selective mirror layer is reflective (measured at normal incidence) may be referred to as the reflection band. In a further embodiment, the transmissivity of the wavelength-selective mirror layer is at least 75% to light of wavelengths outside the reflection band. In a further embodiment, the reflectivity of the wavelength-selective mirror layer is at least 50% to light of wavelengths outside the transmission band.

The photo-luminescent structure has an area coverage in the range of 5-75%, preferably 5-50%, more preferably in the range of 5-30%, even more preferably in the range of 10-30%. The efficiency of the luminescent optical device is advantageously improved (relative to a continuous layer of luminescent material) with an area coverage in these ranges. Herein, "area coverage" may be defined as the percentage of waveguide surface that is covered by the photo-luminescent domains of the photo-luminescent structure, when the photo-luminescent structure is provided in an external surface of the waveguide. When the photo-luminescent structure is embedded in the waveguide, "area coverage" may be defined as the percentage of area coverage with respect to a projection of the photo-luminescent structure in a onto a surface of the waveguide from above; in particular, when the photo-luminescent domains are provided in a plane extending along the waveguide, "area coverage" may be defined as the percentage of area on that plane with photo-luminescent material relative to the total area of the plane.

In an embodiment, the photo-luminescent domains are generally dot-shaped. The dot-shaped photo-luminescent domains may be substantially circular, square, hexagonal. The shape and arrangement of the photo-luminescent domains may be substantially similar to the shape and arrangement of the lenses, e.g. circular domains with circular lenses arranged in corresponding hexagonal close-packed arrays. The area coverage of all photo-luminescent domains is preferably as described above.

In an alternative embodiment, the photo-luminescent domains are generally line-shaped. The shape and arrangement of the photo-luminescent domains may be substantially similar to the shape and arrangement of the lenses, e.g. line-shaped domains with cylindrical lenses arranged as corresponding one-dimension arrays of parallel lines. The area coverage of all photo-luminescent domains is preferably as described above.

In an embodiment, the luminescent optical device has a thickness in the range of 10 µm to 2 cm, preferably in the range of 10 µm to 5 mm. Thus, a thin luminescent optical device may be provided, which may moreover be a lightweight device, which can be relatively easily handled. Also, such a relatively think luminescent optical device may be flexible.

In an embodiment, the lenses have a smallest width in the range of 5 µm to 2 cm, preferably 5 µm to 5 mm. I.e. circular lenses may have a diameter in the range of 5 µm to 2 cm, preferably 5 µm to 5 mm; cylindrical lenses may have a short axis in the range of 5 µm to 2 cm, preferably 5 µm to 5 mm. The luminescent optical device may thus be provided with a relative large plurality of lenses. These small lenses may be relatively easy to manufacture, in particular with relatively large manufacturing tolerances when compared to lenses of 5 cm diameter or larger. Moreover, small lenses may be advantageously used with relatively thin waveguides.

In an embodiment, the photo-luminescent domains have a smallest width in the range of 1 µm to 1 cm, preferably in the range of 1 µm to 4 mm. I.e. dot-shaped domains may have a diameter in the range of 1 µm to 1 cm, preferably 1 µm to 4 mm; line-shaped domains may have a line width in the range of 1 µm to 1 cm, preferably 1 µm to 1 mm.

In an embodiment, the waveguide has a thickness in the range of 10 µm to 2 cm, preferably in the range of 10 µm to 5 mm. Such thickness may advantageous for using domain sizes and/or lens sizes as described above, and may in particular allow a robust system, which may be manufactured and/or used with large tolerances.

The luminescent optical device may be flexible, preferably rollable and/or bendable with curvatures below 80 cm, preferably below 50 cm, more preferably below 20 cm. This may allow easy transport of the luminescent optical device, and/or easy installation. The luminescent optical device may in particular be arranged to be operable when shaped in a non-flat condition.

In an embodiment, the plurality of photo-luminescent domains containing a photo-luminescent material comprise an oriented photo-luminescent material having a pre-tilt angle in the range of 0°-85°, preferably 5°-85°, more preferably 5°-70°, more preferably 30-70°, relative to an interface surface between the photo-luminescent domains and the optical waveguide. Such oriented photo-luminescent material is e.g. described in EP 1 854 151. The efficiency of coupling emission light into the waveguide may thus be improved. Moreover, the efficiency of transporting light may be improved, as the emission light will experience less reflections during transport along the waveguide when oriented at relatively small angles with respect to the waveguide surface.

In an embodiment, the plurality of photo-luminescent domains containing a photo-luminescent material comprise a fluorescent dye material. Fluorescent dye materials may be well suitable for luminescent optical devices according to the invention. The fluorescent dye may be a commercially available fluorescent dye, such as the fluorescent dyes offered by under the names BASF Lumogen Red305, Yellow083, Orange240 and Violet570. Use of a commercially available fluorescent dye may be economically advantageous. With luminescent optical devices according to the invention, due to its improved transport efficiency along the waveguide, less strict requirements have to be put on Stokes Shift and/or re-absorption of emission light to the fluorescent dye, which may allow to select a fluorescent dye material from a wider range of fluorescent dye materials than possible in known luminescent devices (where a small Stokes Shift and/or a large re-absorption may reduce the transport efficiency).

In an embodiment, the photo-luminescent material emits, during use, emission light in a wavelength range of 300-2500 nm, preferably in the range of 400-1500 nm, more preferably in the range of 800-1200 nm, and even more preferably in the range of 1000-1200 nm. Such ranges may be particularly suitable for efficient conversion into electrical energy with a photovoltaic cell, which may be most efficient around 1100 nm and/or when the emission light has a narrow spectral width. Emission light in the range of 800-1200 nm, more preferably 1000-1200 nm, may moreover be advantageous as it allows to largely spectrally separate the emission light from the excitation light, especially when the photo-luminescent material is arranged to be excited by excitation light with a major fraction in a wavelength range of 350-1000 nm.

In an embodiment, the photo-luminescent material is arranged to be excited, during use, by excitation light in a wavelength range of 300-2500 nm, preferably in the range of 300-1500 nm and more preferably in the range of 350-1000 nm. In such wavelength ranges, luminescent material may be used that have a high quantum efficiency, resulting in an efficient conversion from incident light (excitation light) into emission light. A range of 300-2500 nm, preferably in the range of 300-1500 nm may be advantageous as it uses a relatively large fraction of the spectrum of sun light. A range of 300-1500 nm, preferably 350-1000 nm may be particularly advantageous as it results in a large transport efficiency, especially when the emission light is in the range of in the range of 1000-1200 nm, whereby the emission light and the excitation light are largely separated.

The luminescent particle or molecule is characterized by that it is able to absorb a photon and as a result thereof, it will emit a photon to (partially) release its energy again. Luminescence can be fluorescence, phosphorescence, or any other decay whereby a photon is emitted, wherein the wavelength of the photon in air is between 300 and 1500 nm. The luminescent dye is able to absorb light over a specified range of wavelengths of the optical spectrum—preferably the spectrum visible to the human eye. The photonic energy absorbed is, for a large part, again emitted as a photon of a longer wavelength. The propagation directions of the absorbed photon and the emitted photon are not directly coupled to each other. Furthermore, the term luminescent dye comprises a luminescent molecule or a luminescent quantum dot. The term quantum dot means a semiconducting particle whose excitons are confined in all three spatial directions. It is therefore able to absorb light over a range of wavelengths and emit the absorbed energy as photons over a smaller range of wavelengths. The probability of emission is expressed by the quantum efficiency of the molecule or particle. Quantum efficiency is defined as the ratio of number of photon emitted to the number of photons absorbed. Here, a particle or molecule with a quantum efficiency higher than 8% is regarded as a luminescent particle or molecule. The quantum efficiency should always be measured in the relevant host material, as the quantum efficiency may strongly depend on the environment.

The release of a photon distinguishes luminescence from other ways of decay, such as thermal decay, or the separation of a photoelectron as in sensitized dyes.

The invention provides, in a third aspect, a method of manufacturing a luminescent optical device according to the invention, the method comprising:
a. applying a lens structure comprising a plurality of lenses, to an optical waveguide;
b. applying a non-photocured layer comprising photo-luminescent material to the optical waveguide;
c. exposing the non-photocured layer through the lens structure with exposure light, thus creating a plurality of exposed photocured photo-luminescent domains in a non-photocured environment of the non-photocured layer; and
d. removing the non-photocured environment, while maintaining the plurality of exposed photocured photo-luminescent domains as a photo-luminescent structure comprising a plurality of photo-luminescent domains arranged to emit emission light upon excitation by excitation light.

The method advantageously allows the manufacture of a luminescent optical device with a lens structure on a top surface of a waveguide with luminescent domains at a bottom surface of the waveguide, especially when comprising a large plurality of lenses, and/or small-sized luminescent domains. The method may in particular be advantageous as it does not require an alignment of the plurality of lenses of the lens structure (that is independently produced from the luminescent structure) with the plurality of luminescent domains of the luminescent structure. Moreover, the method may be used in a roll-to-roll process.

In a further embodiment, the method allows to manufacture a luminescent optical device with a lens structure on a waveguide surface with luminescent domains embedded in the waveguide. For this purpose, the method further comprises
e. applying a further optical waveguide to the optical waveguide for extending the optical waveguide such as to embed the plurality of exposed photo-luminescent domains in the optical waveguide.

The further optical waveguide and the optical waveguide provided in stage a of the method thus together form an optical waveguide embedding the luminescent domains.

The invention provides, in a fourth aspect, a method of manufacturing a luminescent optical device according to the invention, the method comprising:
a. applying a non-photocured layer comprising photo-luminescent material to a lens structure comprising a plurality of lenses;
b. exposing the non-photocured layer through the lens structure with exposure light, thus creating a plurality of exposed photocured photo-luminescent domains in a non-photocured environment of the non-photocured layer; and
c. removing the non-photocured environment, while maintaining the plurality of exposed photocured photo-luminescent domains as a plurality of photo-luminescent domains arranged to emit emission light upon excitation by excitation light; and
d. attaching an optical waveguide to the lens structure while contacting the optical waveguide to the plurality of exposed photo-luminescent domains.

The method advantageously allows the manufacture of a luminescent optical device with a lens structure on a top surface waveguide with luminescent domains in between the lens structure and the top surface of the waveguide, especially when comprising a large plurality of lenses, and/or small-sized luminescent domains.

The invention provides, in a fifth aspect, a solar cell system comprising:
a. a luminescent optical device according to the invention; and
b. a photovoltaic cell, wherein the photovoltaic cell is arranged to receive emission light from the waveguide.
wherein the optical waveguide comprises an optical exit surface(s), arranged to allow at least part of the emission light to escape from the optical waveguide, and wherein the photovoltaic cell comprises a light receiving surface, wherein the light receiving surface is arranged to receive emission light escaping from the optical waveguide by the optical exit surface(s).

Advantages of the solar cell system will be clear from the description of the luminescent optical device above. The photovoltaic cell(s) could be arranged to receive light from, e.g. by being attached to, one, two or more edges of the waveguide. The waveguide could be three, four or more sided. The photovoltaic cell(s) could conceivably also be attached to the top or bottom surface of the waveguide as well, and not solely the edge(s).

In an embodiment, the optical exit surface and the light receiving surface are in contact with each other. This may advantageously allow an efficient transfer of emission light from the optical device onto the photovoltaic cell.

In an embodiment, the solar cell system further comprises a light collection waveguide, arranged to receive emission light escaping from the optical waveguide by the optical exit surface, and arranged to transport the emission light as received to the light receiving surface, whereby the light receiving surface is arranged to receive emission light escaping from the optical waveguide by the optical exit surface. The light collection waveguide may in particular result in a reduced size of the light receiving surface, which may reflect in a reduced cost of the photovoltaic cell.

The invention provides, in a sixth aspect, a use of a solar cell system according to the invention for providing electrical energy from a photovoltaic cell. Such use may provide electrical energy with a high efficiency. Moreover, such use may provide electrical energy at relatively low cost, as the solar cell system according to the invention may be relatively inexpensive. More advantages may be clear from the description of the luminescent optical device above.

The invention provides, in a seventh aspect, a use of a luminescent optical device according to the invention for concentrating incident light provided from an external light source, preferably the sun. Such use may concentrate incident with a high efficiency, e.g. to a photovoltaic cell, or to alternative devices such as thermal collectors wherein the incident light directly heats a liquid, and heat is extracted from the liquid using e.g. a heat exchanger to be converted into electrical energy. Such use may also be used to concentrate incident light to provide lighting to an indoor space, e.g. while using a luminescent optical device according to the invention arranged outside of a building, from which concentrated light is guided through waveguides and/or light pipes to the indoor space. More advantages may be clear from the description of the luminescent optical device above.

The term "luminescent" as used herein refers to the capability of a material to emit light upon absorption of light or other radiation of sufficient quantum energy. The term includes both fluorescence and phosphorescence.

The term "light" as used herein refers to optical radiation which may be visible or invisible to the human eye.

The term "optical radiation" refers to electromagnetic radiation in the wavelength range between 100 nm and 2000 nm.

The term "photoluminescence" as used herein refers to luminescence generated by the absorption of light. The term "luminescent" and "photo-luminescent" may be used interchangeably herein.

The term "photoluminescent material", which may also be referred to as "luminescent material" herein, as used herein refers to atoms or molecules, including ions that are capable of photoluminescence. The term "photoluminescent material" also encompasses combinations of two or more different photoluminescent components, e.g. combinations of two or more different photoluminescent molecules. The term "photoluminescent material" also encompasses guest-host systems comprising a fluorescent molecule, fluorescent polymers and/or co-polymers.

The term "optical waveguide" or "waveguide" as used herein refers to optical components that are transparent to light and that confine optical radiation from an input to a desired output. The term "waveguide" may relate to an optical component with a uniform refractive index, such as a planar plate of transparent material, and may alternatively relate to an optical component wherein the refractive index is varying throughout its volume (which may be referred to as a gradient refractive index). The term "waveguide" may in particular relate to an optical component wherein light can propagate efficiently by total internal reflection.

The term "transparent" as used herein means that a material transmits most incident solar light and/or light emitted by the photoluminescent material. More particularly, the term "transparent" means that said material transmits at least 50%, preferably at least 60%, more preferably at least 70%, and most preferably at least 90% of said light, measured for light incident perpendicular to the surface of the object that is exposed to said incident light.

The term "transparent waveguide" as used herein means that a waveguide transmits most incident solar light and/or light emitted by the photoluminescent material. More particularly, the term "transparent waveguide" means that said waveguide transmits at least 50%, preferably at least 70% of said light measured for light incident perpendicular to the waveguide.

The term "reflective" as used herein means that a material reflects most incident (solar) light and/or light emitted by the photoluminescent material. More particularly, the term "reflective" means that said material reflects at least 50%, preferably at least 60%, more preferably at least 80% and most preferably at least 90% of said light. The reflectivity of a material is determined for light incident perpendicular to the reflecting surface.

The term "transmissive" as used herein means that a material transmits most incident (solar) light and/or light emitted by the photoluminescent material. More particularly, the term "transmissive" means that said material transmits at least 50%, preferably at least 60%, more preferably at least 75% and most preferably at least 90% of said light. The transmissivity of a material is determined for light incident perpendicular to the transmitting surface.

The term "wavelength selective mirror" as used herein refers to mirrors which are transparent at specific wavelengths and reflective at other wavelengths, optionally in combination with polarization selectivity. A variety of such mirrors are known in the literature.

The terminology "cholesteric layer of chiral nematic polymer" refers to a layer comprising polymers whose mesogenic groups are aligned predominantly parallel to the surface of the layer and in which the molecules rotate with respect to each other in a pre-specified direction which is induced by a chiral reactive or non-reactive dopant.

Such a cholesteric layer may form a wavelength selective mirror. These wavelength selective mirrors can be wavelength tuned (see for example Katsis et al (1999) Chem. Mater. 11, 1590)) or bandwidth tuned (see for example Broer et al (1995) Nature 378, 467).

The term "refractive index" refers to the refractive index as experienced by the optical radiation, and may in particular relate to the refractive index as experienced by the wavelength of the optical radiation, and/or the plurality (or range) of refractive indices as experienced by a plurality of wavelengths (or wavelength range) of the optical radiation The term "refractive index of the waveguide" refers to the refractive index of the waveguide in the isotropic state. In specific cases, oriented waveguides may be used which exhibit birefringence due to, for instance, flow during the production process. Where the waveguide has a changing refractive index throughout its volume, the term "refractive index of the waveguide" refers to the refractive index at a location where the optical radiation, or light, experiences the refractive index.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 1 and FIG. 2 a-c) schematically show a luminescent optical device according to the prior art;

FIG. 3 schematically illustrates an effect of a first aspect of the invention;

FIG. 4 shows a frontal view of a device according to the invention showing in-plane color gradients.

FIGS. 12 to 14 schematically illustrate further preferred embodiments according to the first aspect of the present invention.

FIG. 15 schematically shows a luminescent optical device according to the invention;

DETAILED DESCRIPTION

Figure 5:
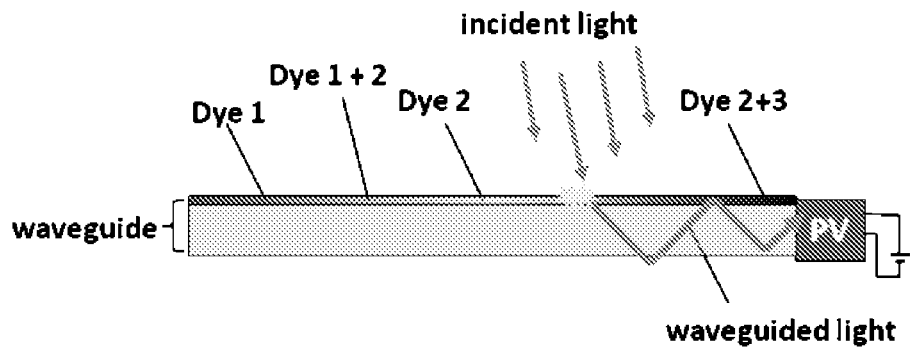
FIG. 5 schematically shows an inventive LSC with variation in concentration of several dyes in the plane of the waveguide.

FIG. 1 schematically shows a luminescent optical device 10a for use with a photovoltaic cell (PV cell; not shown) according to the prior art. A luminescent layer 1000 is laminated onto a planar waveguide 200, e.g. with an area of 30 cm×30 cm and a thickness of 1 cm. When incident light 1, e.g. sun light, is incident on the luminescent optical device 10a, the incident light 1 will be travel from upper surface 201 of the waveguide 200 through the waveguide 200 to the luminescence layer 1000 provided on the lower surface 202 of the waveguide 200. The luminescent layer 1000 is a continuous layer comprising luminescent material which emits emission light 2 upon excitation by incident light, or more particular, at least a part of the spectrum of the incident light which may be referred to as excitation light. In the example shown, the luminescent layer contains a plurality of isotropically arranged photoluminescent dye molecules, and the photoluminescent dye molecules thus emit the emission light in substantially all directions. FIG. 1 shows the emission light 2 resulting from one light ray 1' of the incident light, emitted by a first volume 1001 of luminescent material in the luminescent layer 1000. The emission light 2 is partially coupled into the waveguide 200 and propagated by total internal reflection at the upper surface 201 of the waveguide and, at least partially, by reflection at the lower surface 202 of the waveguide, as is indicated for rays 3 and 4 of emission light. The skilled person will appreciate that, although light rays 3 and 4 are drawn to (partially) reflect on surface 202 at positions 1002 and 1003 in the schematic drawing in FIG. 1, the light rays may actually propagate into the luminescent layer 1000 at positions 1003 and 1002, and may propagate through the luminescent layer to actually (partially) reflect only on the bottom surface of the luminescent layer, when not reabsorbed in the luminescent layer 1000. Part of the emission light 2 may be lost as it is not coupled into a waveguide 200, e.g. as shown for ray 5 of emission light, which is not completely reflected at the upper surface 201 of the waveguide as its angle of incidence is outside the critical angle. As the emission light 2 will generally comprise optical radiation within the spectral range of the excitation light due to the limited Stokes Shift of the luminescent material, part of the emission light 2 will be reabsorbed by the luminescent layer 1000 when the emission light during propagation along the waveguide 200, e.g. in a second volume 1002 of luminescent material on the optical path of ray 3 as shown in FIG. 1. Also, part of the emission light 2 may scatter out of the waveguide 1000, as the luminescent layer 1000 may frustrate the total internal reflection at volume 1002. It will thus be understood that when the waveguide 200 is of a significant length, the emission light 2, 3, 4 will have multiple re-absorptions and scatterings at the luminescent layer 1002, resulting in a low efficiency of coupling the emission light 2 towards an exit area of the waveguide and towards the PV cell.

FIG. 3 schematically illustrates an effect of a first aspect of the invention. FIG. 3 schematically shows a luminescent optical device 10b which differs at least from the luminescent device 10a of FIG. 1 in that the luminescent layer 1000 is replaced by a luminescent structure 100 comprising a plurality of luminescent domains 110 of luminescent material. The luminescent domains 110 are positioned along the lower surface 202 of the waveguide 200, with a spacing between adjacent luminescent domains. Thus, a clear waveguide surface is provided in between the luminescent domains; this is indicated in FIG. 3 by position 102, which corresponds to the same position as volume 1002 in FIG. 1. Herein, the term "clear waveguide surface" refers to the part of the waveguide surface not being covered with luminescent material. As a result, part of the emission light, for example ray 3, is allowed to propagate along the waveguide 200 without further interaction with the luminescent material, and will experience total internal reflection at both the upper surface 201 as well as the lower surface 202 of the waveguide while propagating. Another part of the emission light, for example ray 4, may still experience further interaction while propagating, as it will encounter another luminescent domain 110 while propagating. This other part may be reabsorbed, and possible partly reemitted, at the volumes of luminescent material 103 which is encounters while propagating. The efficiency of transporting emission light along the waveguide is thus advantageously increased. The efficiency increase is dependent on the relative area coverage of the lower surface 202 of the waveguide 200 by the luminescent domains 110. However, the efficiency of converting incident light 1 into emission light 2 may be reduced, as a part of the incident light 1 will not encounter the luminescent domains 110 and may leave the luminescent object 10b substantially unaffected: FIG. 3 shows that incident light ray 1a is incident on one of the luminescent domains 110, and will thus generate emission light 2, but incident lights rays 1b do not encounter any luminescent domain 110.

FIG. 5 illustrates one embodiment of the invention. A dye layer with varying concentrations of luminescent dyes is coated onto a waveguide. The luminescent dyes emit part of the luminesced light into waveguiding mode. This light is waveguided to the side of the plate where it is converted into electrical energy using a photovoltaic element.

In another preferred embodiment the luminescent dye(s) is (are) present in a film on top of the waveguide.

Figure 6:
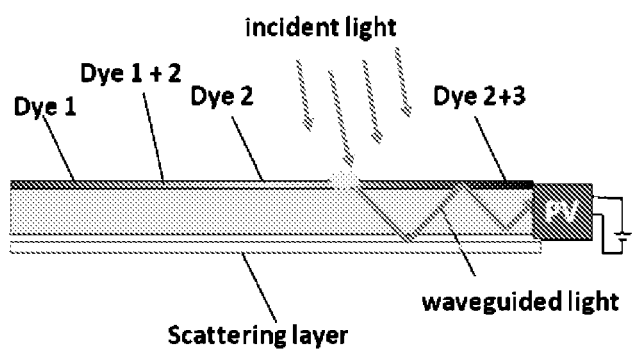
FIG. 6 schematically shows the system from FIG. 3 with a scattering layer.

All possible variations that are known to LSC's can be applied to the system. For example, the system can be used in combination with a scattering background layer (FIG. 6).

The system may be used in conjunction with a selectively reflecting layer, such as a multilayer inorganic or organic stack photonic layer or a cholesteric layer. The system may be used in conjunction with a partially shading layer for additional optical effects.

Figure 7:
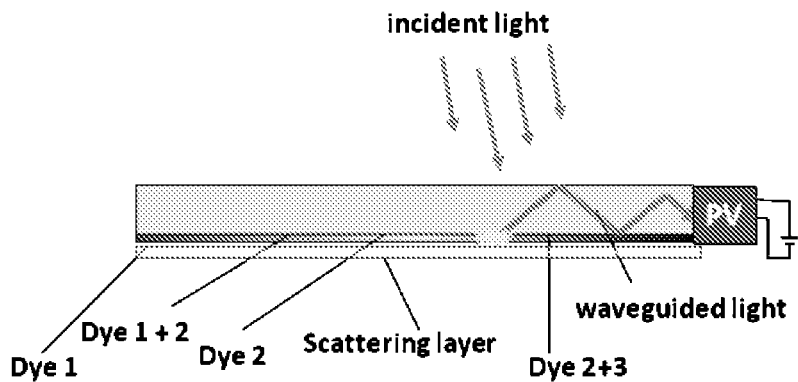
FIG. 7 schematically shows an LSC with a dye layer at the bottom of the system.
Figure 8:
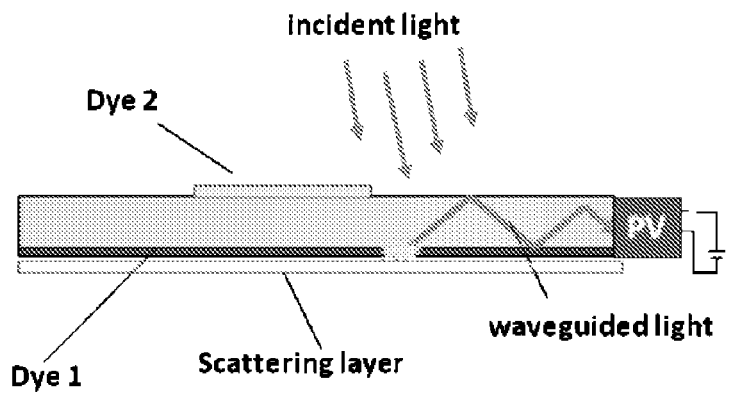
FIG. 8 schematically shows an LSC with one dye patterned at the top and another dye fully covering the bottom layer.
Figure 9:
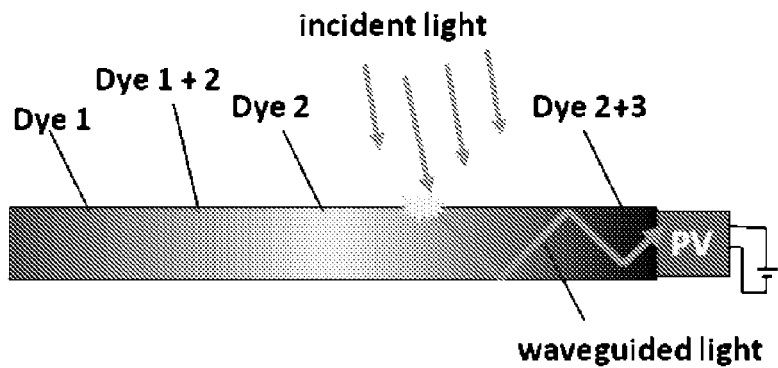
FIG. 9 schematically shows an LSC with filled waveguide with varying dye concentration.

Also, the dyes can be applied at different depths in the system. FIG. 7 illustrates a configuration where the luminescent dye layer is at the bottom of the waveguide. FIG. 8 shows a configuration where one luminescent dye is patterned at the top surface and another luminescent dye is at the bottom layer. FIG. 9 shows a configuration with a 'filled' waveguide where the dye is equally distributed of the depth of the waveguide, but patterned in the width of the waveguide.

The recognizable differences in colors or differences in intensity, resulting from the variations in dye concentrations, can be measured as follows. Spectral data is taken on several spots of the LSC using a light source with known spectrum and intensity, for example using a spectrophotometer. These spectral data are taken in transmissive mode or reflective mode: transmissive for the case where the LSC is used with a light source behind or reflective when it is illuminated from the front. With these data and the spectral data and intensity of the illuminant, the observed colors can be calculated for the relevant color space, for example the CIE 1976 (L*, a*, b*) color space. Different points in the color space represent different observed colors.

The waveguide can be a fibre or a flat plate waveguide. Preferably, the waveguide is a flat plate waveguide. Optionally, there are geometrical alterations to the flat plate to promote local outcoupling of the light.

Figure 10:
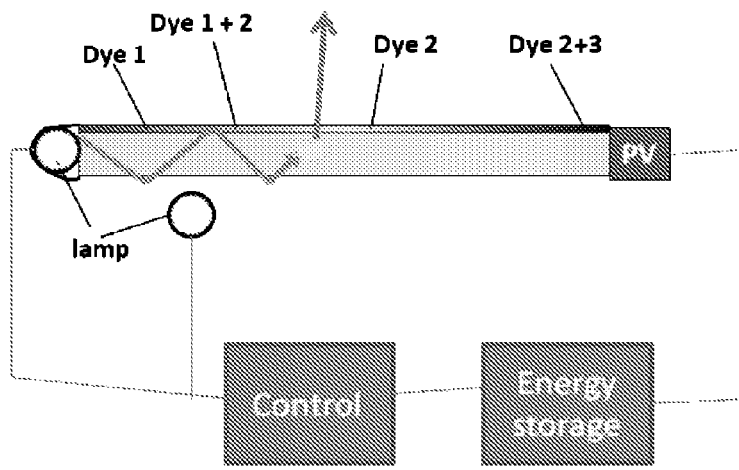
FIG. 10 shows a potential use of the system using lighting to illuminate the pattern of the luminescent dye.

One potential usage of the system is illustrated in FIG. 10. The energy generated by the LSC is stored and used at a desired moment to illuminate the dye pattern of the LSC using lamps that are placed behind the LSC or are optically coupled to the LSC to couple in light.

Figure 11:
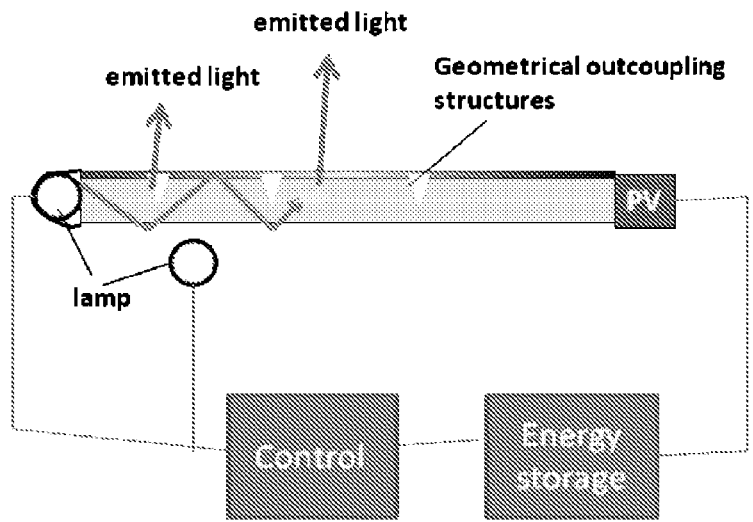
FIG. 11 shows another potential use of the system employing outcoupling structures.

When lighting is used, the flat waveguide can be modified with geometrical outcoupling structures, such as triangular indentations, to promote local outcoupling from the waveguide. FIG. 11 shows this situation.

The LSC designed in this way would have advantages over normal signage in that the LSC sign is capable of generating electrical current from solar energy, whereas the normal signage does not.

Figure 12:
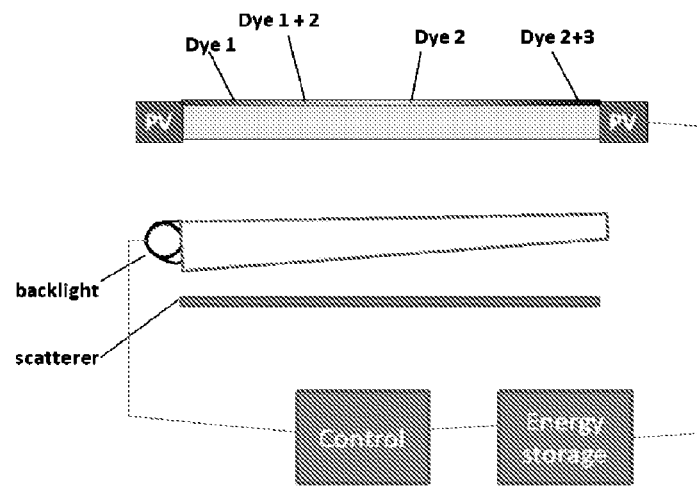

FIG. 12 schematically illustrates a preferred embodiment, wherein the patterned LSC generates electricity in daytime that is stored in an electric energy storage. Light that is not absorbed by the LSC is scattered back to the viewer by a scatterer at the back. At night, a backlight that is placed in between the LSC and the scatterer provides illumination of the sign. Instead of a backlight, a frontlight can also be used.

Figure 13:
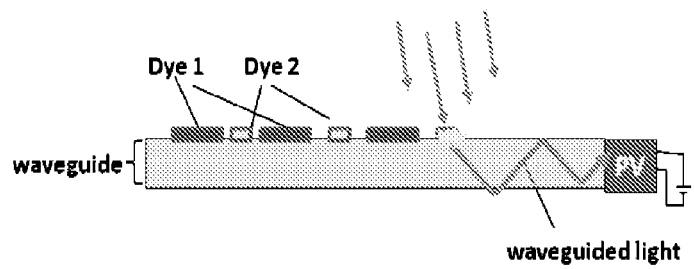

FIG. 13 schematically illustrates a further preferred embodiment, wherein the regions of different colors are patterned with minimal physical overlap in the plane. Mixing of colors is achieved by using dots or pixels.

It is preferred that if regions of different colors are stacked on top of each other, the color that absorbs the longest wavelength (e.g. red or blue) is printed on top of the color that absorbs shorter wavelengths (e.g. yellow, green or orange). For example, FIG. 14a is preferred over the situation of FIG. 14b. This has the benefit that in general the LSC output is higher.

FIG. 15 schematically shows a luminescent optical device 10 according to the invention. The luminescent optical device 10 differs from the luminescent device 10b of FIG. 3 in that that the luminescent optical device 10 further comprises a lens structure 300, comprising a plurality of lenses 310. Each lens 310 of the plurality of lenses 310 is arranged concentrate incident light onto a respective luminescent domain 110 of the plurality of luminescent domains 110 of the luminescent structure 200. As a result, ray 1a as well as rays 1b will travel to the luminescent domain 110. The upper surface 201 is preferably substantially fully covered with the plurality of lenses 310, whereby substantially all incident light onto the luminescent optical device 10 is incident on luminescent material in luminescent domains 110 of the luminescent structure 200. The incident light is thus efficiently directed to the luminescent material. The efficiency of converting incident light 1 into emission light 2 may thus be improved.

Figure 16:
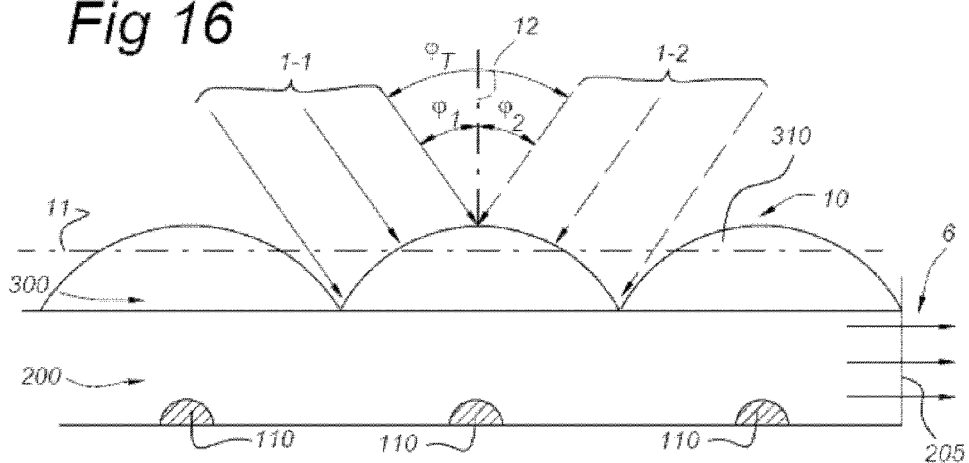
FIG. 16 schematically shows a use of the luminescent device according to the invention.

FIG. 16 schematically shows a use of the luminescent device 10 according to the invention. FIG. 16 shows a top surface 11 of the luminescent device 10, which is substantially parallel to the waveguide 200, lens structure 300 and luminescent structure 100 comprising a plurality of luminescent domains 110. The top surface 11 has a normal 12, perpendicular to the plane of the top surface. A first angular direction $\phi_1$ of incident light 1-1 and a second angular direction $\phi_2$ of incident light 1-2 are indicated relative to the normal 12. The optical device 10 is arranged to concentrate incident light onto the plurality of luminescent domains 110 when incident light is received by the luminescent device 10 at an angular direction in between the first angular direction $\phi_1$ and the second angular direction $\phi_2$. An angular acceptance range $\phi_T$ may be defined as the absolute value of the difference between the first angular direction $\phi_1$ and the second angular direction $\phi_2$. The angular acceptance range $\phi_T$ may e.g. be 40°, with $\phi_1=-20°$ and $\phi_2=+20°$, or $\phi_T=60°$ with e.g. $-30°$ to $+30°$, and $\phi_T=120°$ with $-60°$ to $+60°$. The angular acceptance range may be defined relative to the horizontal, corresponding to the change in elevation angle of the sun during the day. The angular acceptance range may be defined relative to the north-south direction, corresponding to the change in azimuth angle while the sun travels from east to west the sun during the day. It will be appreciated that it is also possible that a first angular acceptance range may be defined relative to the horizontal and a second angular acceptance range may be defined relative to the vertical. The luminescent device 10 according to the invention may thus be used for efficiently receiving sun light largely irrespective of the position of the sun, i.e. largely independent of the time of the day and the date of the season. FIG. 16 further shows that the luminescent device 10 has an optical exit surface 205, whereby emission light, after being transported from the luminescent domains 110 through the waveguide 200 to the optical exit surface 205, can be coupled out of the waveguide 200 as device emission light 6, e.g. to a photovoltaic cell The angular acceptance range is defined from the design of the lenses, waveguide and luminescent structure. When the luminescent domains 110 are relatively small, the lenses 310 are preferably aspherical lenses designed to keep their focal points substantially at the position of the luminescent domains 110 for incident light within the angular acceptance range.

Figure 17:
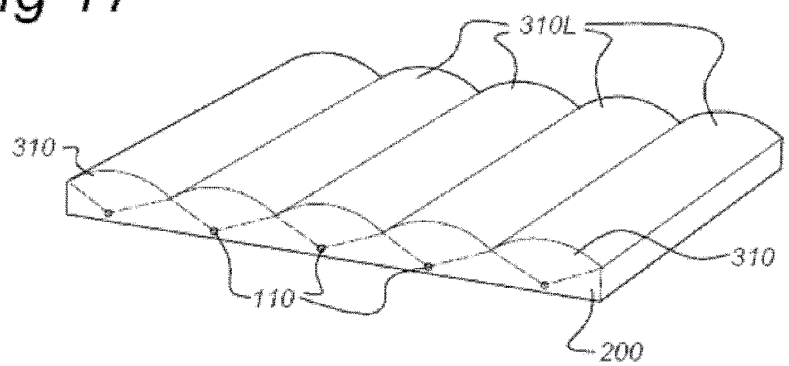
FIG. 17 and FIG. 18 schematically show luminescent optical devices according to embodiments of the invention.

FIG. 17 schematically shows a luminescent optical device 10 according to the invention according to a first embodiment. The lens structure 300 has a plurality of lenses 310, which extend along a long axis perpendicular to a short axis, the lenses 310 have a generally line-shaped focus on respective line-shaped luminescent domains 110 extending parallel to the ling axis of the respective lens 310. These lenses may further be referred to as cylindrical lenses 310L. The cylindrical lenses 310L are arranged side-by-side in a one-dimensional array. Each cylindrical lens has an aspherical cross section over the short axis of the lens 310L. The cross section is substantially constant over the long axis of the lenses 310L. The luminescent optical device 10 is preferably oriented during use with the long axis of the cylindrical lenses 310L arranged substantially east-west, and its short axis north-south, thereby focusing sun light onto the luminescent domains 310 over a large section of the sun's altitude trajectory.

Figure 18:
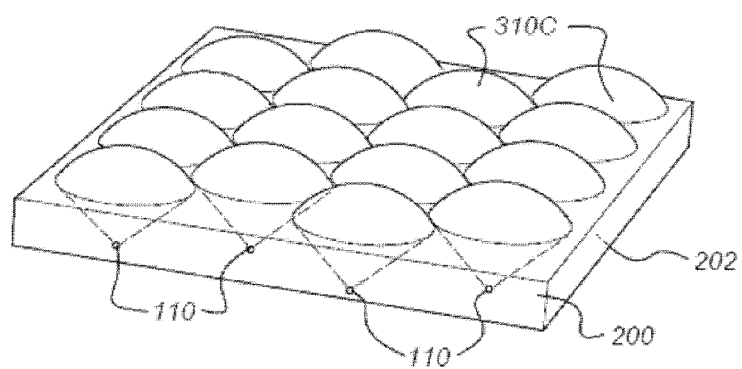

FIG. 18 schematically shows a luminescent optical device 10 according to the invention according to a second embodiment. The lens structure 300 has a plurality of lenses 310, which have a substantially circular shape (when observed in a top view), the lenses 310 have a generally dot-shaped focus on respective dot-shaped luminescent domains 110. These lenses may further be referred to as circular lenses 310C. The circular lenses 310C are arranged side-by-side in a two-dimensional array. In the example shown, the two-dimensional array is a square grid, but the two-dimensional array may alternatively be e.g. a hexagonal array wherein the circular lenses 310C are arranged in a closed-packed arrangement. The luminescent domains 310 are arranged in a corresponding two-dimensional array. Each circular lens 310C has an aspherical cross section over its diameter in any direction, which is designed to provide a large angular acceptance range over a large section of the sun's altitude trajectory. The angular acceptance range may e.g. be 60°, accepting sun light incident at angles between −30° and 30° for a 30% area coverage of the luminescent domains 310 relative to the bottom surface 202 of the waveguide 200. In a preferred embodiment, the angular acceptance range is larger than 90°, accepting sun light incident at least at angles between −45° and 45° for a 30% area coverage of the luminescent domains 310 relative to the bottom surface 202 of the waveguide 200.

Figure 19:
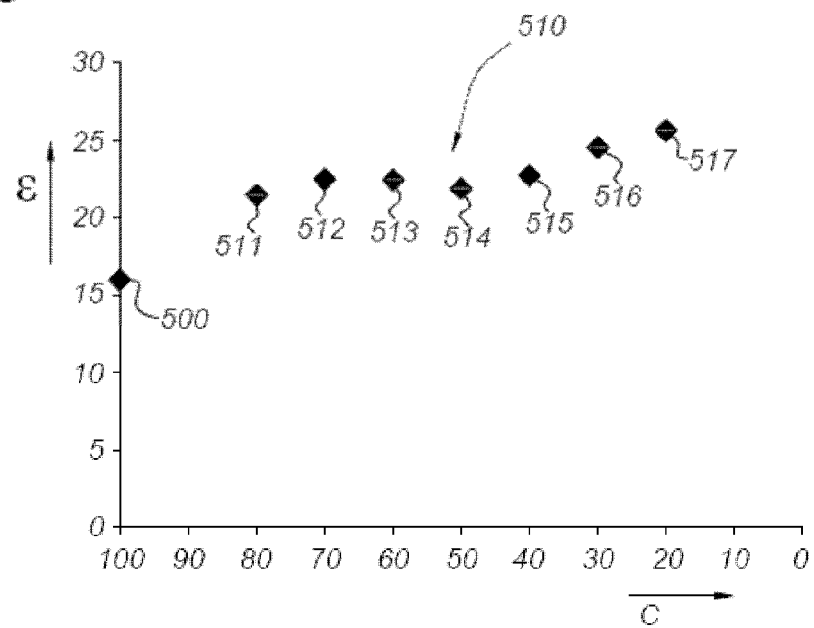
FIG. 19 schematically shows an exemplary measurement of efficiency of an exemplary luminescent optical device according to the invention.

FIG. 19 schematically shows an exemplary measurement of efficiency of an exemplary luminescent optical device 10 according to the invention. FIG. 19 shows efficiency c as a function of area coverage C of line-shaped luminescent domains 310L relative to the bottom surface 202 of the waveguide 200 for an exemplary luminescent optical device 10 according to the invention. The exemplary luminescent optical device 10 comprises a PMMA waveguide 200 and 10 photoembossed line-shaped luminescent domains 310 of a commercially available dye, the so-called Lumogen Red305 dye from BASF, in cross-linked acrylate. In this example, the waveguide 200 has a thickness of 5 mm and a size of 50×50 mm. The efficiency ε is defined as $\epsilon = P(\text{emitted})/P(\text{absorbed})[\%]$, wherein P(absorbed) corresponds to the power of the incident light absorbed by the luminescent domains, and P(emitted) corresponds to the power of the device emission light 2 emitted by the luminescent optical device 10 (refer to FIG. 16). A measurement series 510 is shown with measurements 511, 512, 513, 514, 515, 516 and 517, for an area coverage of 80%, 70%, 60%, 50%, 40%, 30% and 20% respectively: the efficiency ε ranges from approximately 22% to 25% for the optical device according to the invention. FIG. 19 also shows a measurement 500 of the efficiency ε for coverage of 100%: for such an optical device, the efficiency is approximately 16.5%, which is typically for a prior art device 10a as shown in FIG. 1. The optical device according to the invention thus provides a significant increase in efficiency, from 16.5 to 22-25%, i.e. a relative increase of approximately 33-50%.

Figure 20:
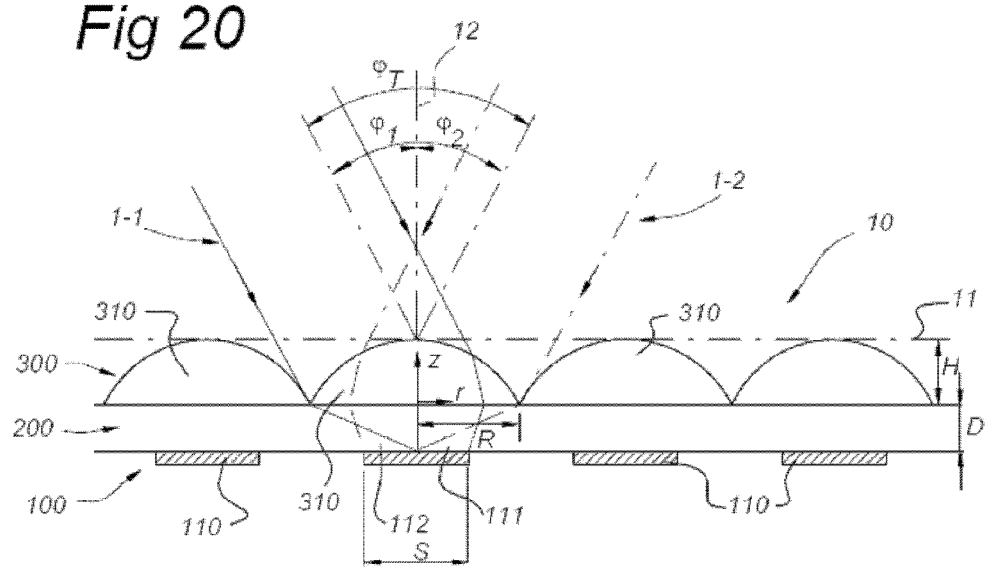
FIG. 20 schematically shows a cross section of a lens structure with aspherical lenses according to an embodiment of the invention.

FIG. 20 schematically shows a cross section of a lens structure 300 with aspherical lenses 310 in an exemplary luminescent optical device 10 an embodiment of the invention. FIG. 20 shows incident light 1-1, 1-2 for one of the lenses 310. The incident light 1-1, 1-2 is concentrated on a corresponding luminescent domain 110 with a domain size S, which may also be referred to as a domain diameter. In particular, incident light 1-1, incident at first angular direction $\phi_1 = -30°$ is concentrated on a part 111 of the luminescent domain 110, and incident light 1-2, incident at second angular direction $\phi = +30°$ is concentrated on a part 112 of the luminescent domain 110. Parts 111 and 112 overlap partially in this example. The aspherical lens 310 has a cross-section that can be defined according to a general formula:

$$z = \frac{Cr^2}{1 + \sqrt{1 - (1+K)C^2r^2}} + \sum_{n=2}^{10} A_{2n} r^{2n}$$

wherein:
  r may be referred to as a radial position and corresponds to a distance in the lens plane relative to the center of the lens, which runs from −R to +R, with R being the lens radius;
  z corresponds to a thickness of the lens as a function of the radial position;
  n is an integer running from 2 to 10;
  C corresponds to the curvature of a front surface of the lens and C has a non-zero, positive value;
  K may be referred to as a conic constant and has a non-zero value;
  $A_{2n}$, may be referred to as a plurality of polynomial coefficients.

This exemplary lens has a lens radius R=0.47 mm, corresponding to a lens diameter of 0.94 mm, and a lens thickness H of approximately 0.4 mm, with the conic constant K=−0.2433, the curvature C=2.0538 mm, A4=1.236, A6=3.366, A8=5.863, and the higher-order coefficients A10, . . . , A20=0. The exemplary lens is used in an exemplary luminescent optical device 10, wherein the waveguide has a thickness D of 0.1 mm. The luminescent domains 110 are aligned with respect to the lenses 310. Each of the luminescent domains is a substantially circular dot-shaped domain with a diameter S of 0.54 mm. Other exemplary luminescent devices may e.g., have substantially rectangular dot-shaped domains with a length of approximately 0.65 mm and width S of approximately 0.54 mm each, substantially elliptical dot-shaped domains with a long axis of approximately 0.65 mm and a short axis S of approximately 0.54 mm, or substantially line-shaped domains extending along the length of the waveguide with a line width S of approximately 0.54 mm. The exemplary luminescent optical device 10 is designed for an angular acceptance range $\phi_T$ of approximately $\phi_T = 60°$, extending from approximately $\phi_1 = -30°$ to $\phi_2 = +30°$ in the angular direction associated with the domain dimension S.

When the domains are substantially line-shaped domains, each line-shaped domain may be associated with a single corresponding cylindrical lens 310L. Alternatively, the plurality of lenses may be arranged in a plurality of lens arrays, wherein each lens array comprises a subset of the plurality of lenses, and wherein each line-shaped domain is associated with one corresponding subset. Each subset may e.g. comprise a plurality of circular lenses 310C that are positioned side-by-side and aligned with the line-shaped domains and are this arranged to focus incident light on one line-shaped domain.

FIG. 21a-FIG. 21d show some possible arrangements of the luminescent structure 300 in embodiments of the luminescent optical device 10 according to the invention.

Figure 21A:
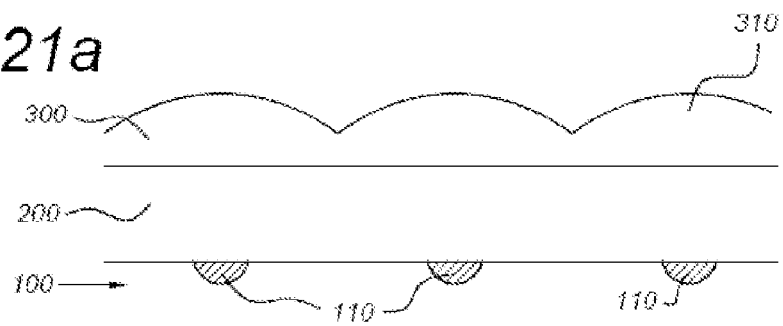
FIG. 21a-FIG. 21d and FIG. 22a-FIG. 22b show some possible arrangements of the luminescent structure in embodiments of the luminescent optical device according to the invention.

FIG. 21a shows a luminescent optical device 10 comprising a lens structure 300 attached to a top surface of a substantially planar waveguide 200. The lens structure 300 consists of plurality of lenses 310 arranged side-by-side on the waveguide 200. A luminescent structure 100 composed of luminescent domains 110 is provided on a flat lower surface of the substantially planar waveguide 200.

Figure 21B:
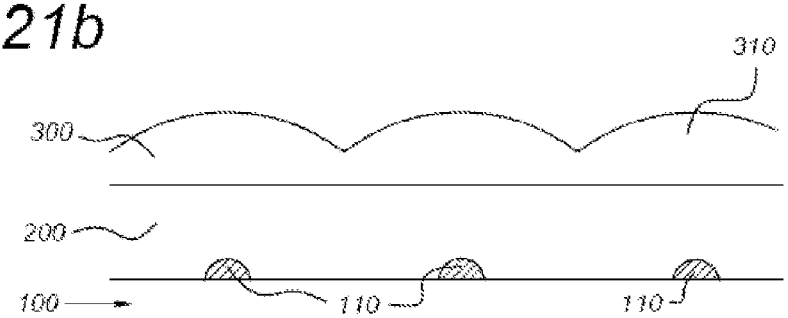

FIG. 21b shows an alternative luminescent optical device 10 comprising a lens structure 300 attached to a top surface of a substantially planar waveguide 200. The lens structure 300 consists of plurality of lenses 310 arranged side-by-side on the waveguide 200. Luminescent domains 110 of the luminescent structure 100 are provided in a structured lower surface of the substantially planar waveguide 200, e.g. in circular embossed pits for forming dot-shaped luminescent domains or in laterally extending embossed trenches for forming line-shaped luminescent domains.

Figure 21C:
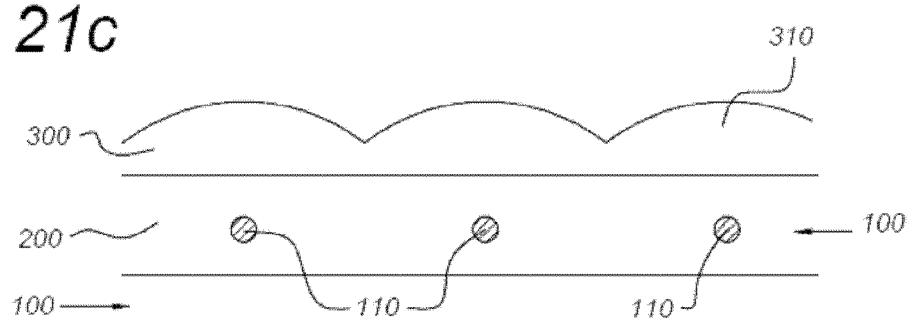

FIG. 21c shows an alternative luminescent optical device 10 comprising a lens structure 300 attached to a top surface of a substantially planar waveguide 200. A luminescent structure 100 composed of luminescent domains 110 is embedded inside the waveguide 200. The luminescent domains 110 are preferably arranged in a plane substantially parallel to the planar waveguide 200. The plane may be located in the middle of the waveguide 200, or asymmetrically within the waveguide 200. The luminescent domains may alternatively be arranged in a plurality of mutually parallel planes, each substantially parallel to the planar waveguide 200, i.e. at various depths in the waveguide 200.

Figure 21D:
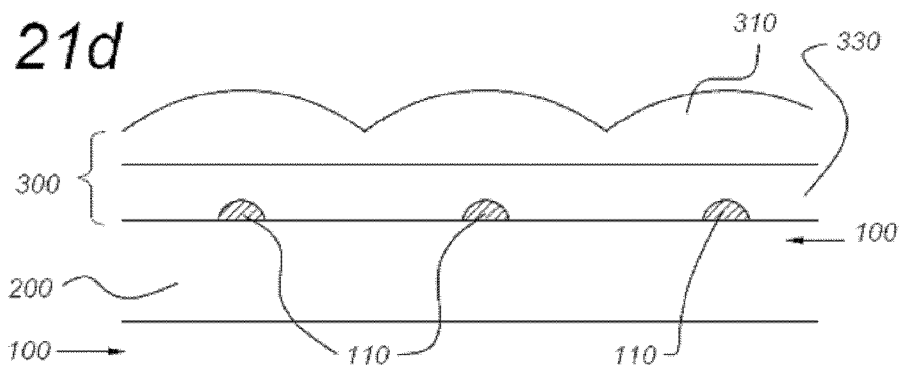

FIG. 21d shows a luminescent optical device 10 comprising a lens structure 300 attached to a top surface of a substantially planar waveguide 200. The lens structure 300 consists of plurality of lenses 310 arranged side-by-side on the waveguide 200 and a wavelength selective mirror layer 330 facing the waveguide 200. A luminescent structure 100 composed of luminescent domains 110 is provided on a flat upper surface of the substantially planar waveguide 200, i.e. in between the lens structure 300 and the waveguide 200. The wavelength-selective mirror layer 330 is arranged to largely reflect emission light emitted by the photoluminescent material upon excitation. The wavelength-selective mirror layer 330 is largely transparent to incident light, in particular the spectral fraction of the incident light that serves as excitation light for the photoluminescent material.

It will be appreciated that alternative embodiments may be designed by the skilled person within the scope of the invention. E.g., a wavelength-selective mirror layer 330 as described in FIG. 21d may be applied at the bottom surface 202 of the waveguide 200, whereby the luminescent domains 110 are included in between the waveguide 200 and the wavelength-selective mirror layer 330, for reflecting emission light that would otherwise escape at the bottom of the luminescent optical device 10 into the waveguide 200. Also, a mirror may be applied on the luminescent domains of FIG. 21a and FIG. 21b for the same purpose. Also, then lens structure 300 may comprise an adhesive layer (not shown) for adhering the lens structure 300 to the waveguide 200. Such adhesive layer may e.g. be used to laminate the lens structure 300 onto the waveguide 200 in manufacturing the luminescent optical device 10. The lens structure 300 could however also be formed directly on the waveguide 200 during manufacturing, e.g. by moulding the lenses 310 directly onto the waveguide 200.

Figure 22A:
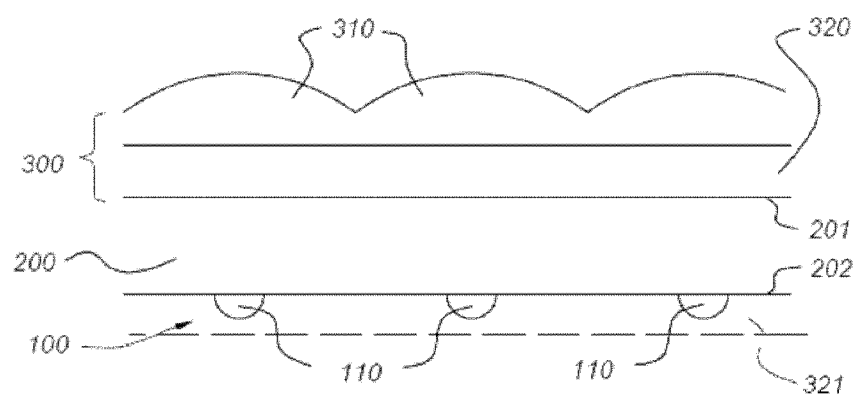
Figure 22B:
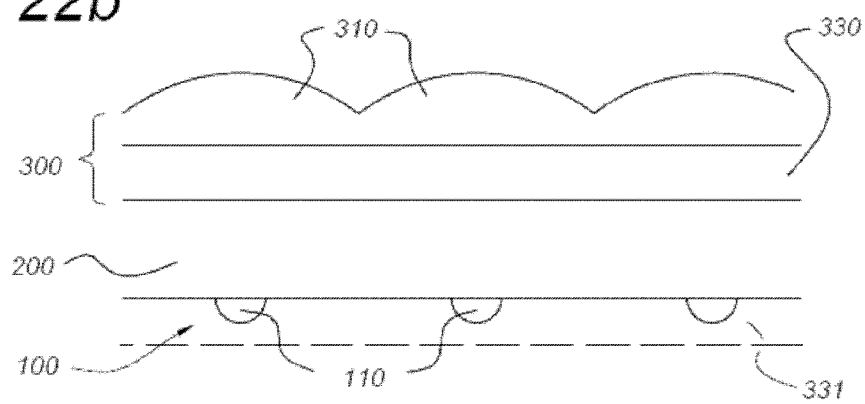

FIG. 22a-FIG. 22b show some possible further embodiments of the luminescent optical device 10 according to the invention, arranged to increase the efficiency of coupling emission light into the optical waveguide 200.

FIG. 22a shows a luminescent optical device 10 comprising a lens structure 300 attached to a top surface 201 of a substantially planar waveguide 200. The lens structure 300 consists of plurality of lenses 310 arranged side-by-side on the waveguide 200 and a first low-refractive index layer 320 facing the waveguide 200. A luminescent structure 100 composed of luminescent domains 110 is provided on a flat lower surface 202 of the substantially planar waveguide 200. In a further embodiment, a second low-refractive index layer 321 is provided on the flat lower surface 202 and the luminescent domains 110, with the luminescent domains 110 arranged in between the waveguide 200 and the second low-refractive index layer 321. The first low-refractive index layer 320 has a refractive index that is smaller than the refractive index of the waveguide 200 at the corresponding contact surface between the waveguide 200 and the first low-refractive index layer 320. The same applies for the second first low-refractive index layer 321, when present. This advantageously increases the amount of emission light coupled into and propagating through the waveguide, as the lower refractive index increases the critical angle and prevents light encountering the lens structure 310, thereby allowing the emission light to satisfy the conditions for total internal reflection over a larger angular range.

FIG. 22b shows a luminescent optical device 10 comprising a lens structure 300 attached to a top surface of a substantially planar waveguide 200. The lens structure 300 consists of plurality of lenses 310 arranged side-by-side on the waveguide 200 and a first wavelength selective mirror layer 330 facing the waveguide 200. A luminescent structure 100 composed of luminescent domains 110 is provided on a flat lower surface 202 of the substantially planar waveguide 200. In a further embodiment, a second wavelength selective mirror layer 331 is provided on the flat lower surface 202 and the luminescent domains 110, with the luminescent domains 110 arranged in between the waveguide 200 and the second wavelength selective mirror layer 331.

In FIG. 22a and FIG. 22b, the first low-refractive index layer 320 and the first wavelength selective mirror layer 330 are provided in between the lenses 310 and the waveguide 200. Alternatively, the first low-refractive index layer 320 and the first wavelength selective mirror layer 330 may be provided on top of the lenses 310, i.e. at the top surface of the luminescent optical device 10 (as is shown in FIG. 23b for an alternative embodiment).

Figure 23A:
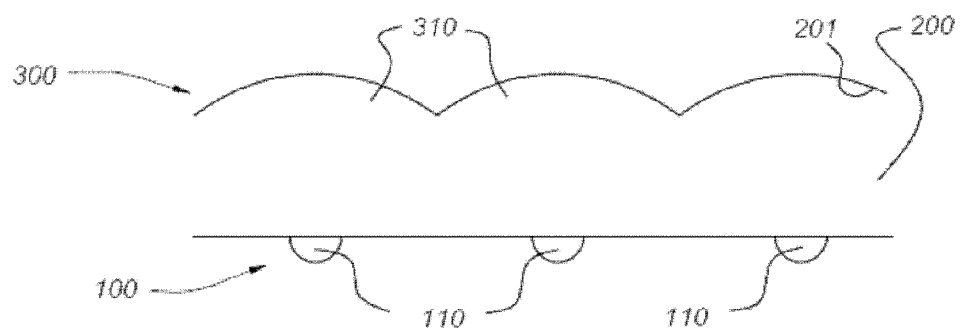
FIG. 23a-FIG. 23b show other embodiments of the luminescent optical device according to the invention.
Figure 23B:
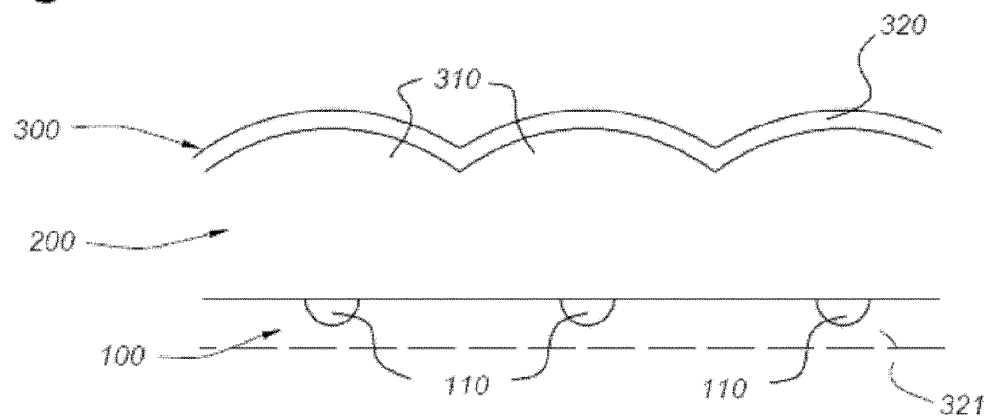

FIG. 23a-FIG. 23b show other embodiments of the luminescent optical device 10 according to the invention. FIG. 23a and FIG. 23b show a lens structure 300 of which the lenses 310 are provided integrally with the waveguide 200, as the upper surface 201 of the waveguide 200 is shaped to accommodate for the, preferably aspherical, shape of the lenses 310. The luminescent structure with the luminescent domains 110 is drawn on the bottom surface of the waveguide 200, but may alternatively be provided embedded in the waveguide similar to FIG. 21c.

The embodiment shown in FIG. 23b comprises a first low-refractive index layer 320 on the top surface of the waveguide 200. Alternatively or additionally, a first wavelength selective mirror layer may be provided on the top surface of the waveguide 200. As described in reference with FIG. 22a and FIG. 22b, this first low-refractive index layer 320 or first wavelength selective mirror layer advantageously increases the amount of emission light coupled into and propagating through the waveguide 200.

Optionally, the embodiments shown in FIG. 23a and FIG. 23b may further comprise a second low-refractive index layer 321 or a second wavelength selective mirror layer 331 on the bottom of the waveguide 200.

Preferably, the wavelength-selective mirror covers at least 80% of one side of the waveguide. Furthermore, it is preferred to employ a relatively thin wavelength-selective mirror. Typically, the thickness of the wavelength-selective mirror does not exceed 100 μm, preferably it does not exceed 20 μm. Usually, the thickness of the aforementioned mirror will exceed 5 μm. It is noted that the wavelength-selective mirror of the present invention may suitably comprise two or more layers that together function as a wavelength selective mirror, e.g. a polymeric or inorganic stack or a combination of cholesteric layers.

In a preferred embodiment of the invention this objective is realized by providing a luminescent object as defined herein before, additionally comprising a wavelength-selective mirror that is at least 50%, preferably at least 60%, more preferably at least 70% and most preferably at least 90% transparent to light absorbed by the photoluminescent materials and that is at least 50%, preferably at least 60% and most preferably at least 70% reflective to radiation that is emitted by the photoluminescent material. The wavelength-selective mirror may advantageously comprise a polymeric or inorganic wavelength selective mirror and/or a polarization selective mirror.

The efficiency with which the present luminescent optical device concentrates radiation emitted by the photoluminescent material may depend on the efficiency with which the wavelength-selective mirror reflects said radiation. Typically, the wavelength-selective mirror exhibits a maximum reflectivity of at least 50%, preferably of at least 60%, more preferably of at least 70% for optical radiation with a wavelength within the range of 500-1200 nm, preferably within the range of 600-1200 nm, and most preferably within the range of 630-1200 nm.

Likewise, and in particular if the wavelength-selective mirror is positioned as a separate layer anywhere between the luminescent layer and the surface that is meant to receive incident optical radiation, it is important that high-energetic radiation that is capable of exciting the photoluminescent material is transmitted by said mirror with high efficiency. Accordingly, the wavelength-selective mirror preferably exhibits a maximum transmittance of at least 60%, preferably of at least 90% for optical radiation with a wavelength within the range of 100-800 nm, preferably within the range of 250-1500 nm, and even more preferably within the range of 350-1200 nm.

The present luminescent object may advantageously contain a wavelength-selective mirror that comprises a cholesteric layer of chiral nematic polymer. In an even more preferred embodiment the polymeric wavelength-selective mirror comprises a first cholesteric layer reflecting right-handed circularly polarized light and a second cholesteric layer reflecting left-handed circularly polarized light, wherein a luminescent aligned polymer layer is sandwiched between the cholesteric layers and a waveguide or wherein a waveguide is sandwiched between the cholesteric layers and a luminescent aligned polymer layer. Preferably, the luminescent aligned polymer layer is sandwiched between the adjacent cholesteric layers and the waveguide. In another even more preferred embodiment, the polymeric wavelength-selective mirror comprises a first cholesteric layer reflecting right-handed circularly polarized light and a second cholesteric layer reflecting right-handed circularly polarized light, wherein the two cholesteric layers are separated by a halfwave plate capable of converting circular polarized light of one orientation to circularly polarized light of the opposite handedness at wavelengths corresponding to the peak reflection wavelengths of the component cholesterics, wherein a luminescent aligned polymer layer is sandwiched between the cholesteric layers and a waveguide or wherein a waveguide is sandwiched between the cholesteric layers and a luminescent aligned polymer layer. Preferably, the luminescent aligned polymer layer is sandwiched between the adjacent cholesteric layers and the waveguide. Cholesteric layers are capable of effectively reflecting a narrow band of circularly polarised radiation. Depending on the helical orientation of the cholesteric layer the layer will reflect either right- or left-circularly polarised radiation. By employing two cholesteric layers with opposite helical orientations, both right- and left-circularly polarised light will be reflected effectively. Alternatively, by employing two cholesteric layers with identical helical orientations separated by a halfwave plate, wherein the halfwave plate converts circular polarized light of one orientation to the opposite orientation may be used for reflecting both right- and left-circularly polarised light will be reflected effectively. The halfwave plate chosen should convert light most efficiently at a wavelength corresponding to the central wavelength of the reflection band of the individual cholesteric layers.

The present luminescent object may also advantageously contain a wavelength-selective mirror that comprises one or more cholesteric layer(s) of chiral nematic polymer. Preferably, the polymeric wavelength-selective mirror comprises one or more layers selected from the group consisting of a cholesteric layer reflecting right-handed circularly polarized light and a cholesteric layer reflecting left-handed circularly polarized light or two cholesterics reflecting right-handed light separated by a halfwave plate. The luminescent aligned polymer layer may be sandwiched between the cholesteric layer(s) and the waveguide or the waveguide may be sandwiched between the cholesteric layer(s) and the luminescent aligned polymer layer. Preferably, the luminescent aligned polymer layer is sandwiched between the adjacent cholesteric layers and the waveguide.

A chiral substance mixed with a nematic material induces a helical twist transforming the material into a chiral nematic material, which is synonymous to a cholesteric material. The cholesteric pitch of the chiral nematic material can be varied over a rather large range with comparative ease. The pitch induced by the chiral substance is, in a first approximation, inversely proportional to the concentration of the chiral material used. The constant of proportionality of this relation is called the helical twisting power (HTP) of the chiral substance and defined by the equation:

$$HTP=1/(c \cdot P)$$

wherein c is the concentration of the chiral substance and P is the induced helical pitch.

The cholesteric layer or combination of cholesteric layers advantageously reflects optical radiation emitted by the luminescent aligned polymer layer and is largely transparent to optical radiation with a wavelength in the range of 350-500 nm, preferably of 250-600 nm and most preferably of 100-800 nm.

In another embodiment, the present luminescent object additionally comprises a wavelength-selective mirror in the form of polymeric stack layer or an inorganic stack layer that is strongly reflective to radiation that is emitted by the photoluminescent material. More particularly, the polymeric or inorganic polarization selective mirror comprises a first polymeric or inorganic stack layer reflecting one plane of polarized light and a second polymeric or inorganic stack layer reflecting the opposite plane of polarized light, wherein a luminescent aligned polymer layer is sandwiched between the polymeric or inorganic stack layers and a waveguide or wherein a waveguide is sandwiched between the polymeric or inorganic stack layers and a luminescent aligned polymer layer.

Polymeric or inorganic stack layers are capable of selectively reflecting optical radiation within a certain wavelength range. Polymeric or inorganic stack layers are also referred to as multilayer reflectors and are used to partition portions of the electromagnetic spectra between reflection and transmission. Polymeric or inorganic stack layers typically employ a number of layers of at least two different materials within an optical stack. The different materials have refractive indices along at least one in-plane axis of the stack that are sufficiently different to substantially reflect light at the interface of the layers. Polymeric or inorganic stack layers can be constructed to reflect optical radiation incident at normal and/or oblique angles of incidence.

Preferably, the polymeric or inorganic stack layers employed in the present luminescent object have been designed to reflect optical radiation above 600 nm, more preferably above 700 nm and most preferably above 800 nm. In a preferred embodiment, the luminescent aligned polymer layer is sandwiched between the polymeric or inorganic stack layer and a waveguide. Polymeric stack layers that are employed as wavelength-selective mirrors in accordance with the present invention may suitably be prepared using the methodology described in U.S. Pat. No. 6,157,490 and Weber, M. F. et al. Science 287, 2451, which are incorporated herein by reference. Inorganic stack layers (Bragg reflectors) that are employed as wavelength-selective mirrors in accordance with the present invention may suitably be prepared using the methodology described in U.S. Pat. No. 5,856,206, among others.

Figure 24A:
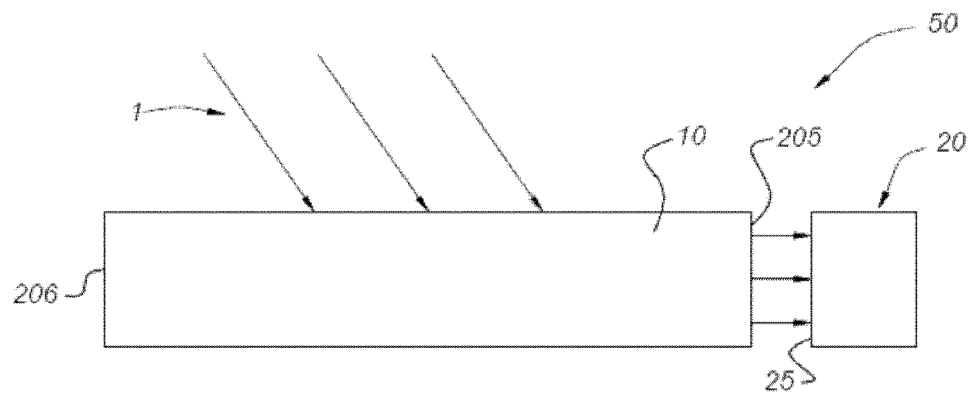
FIG. 24a and FIG. 24b schematically show embodiments of solar cell systems according to the invention.
Figure 24B:
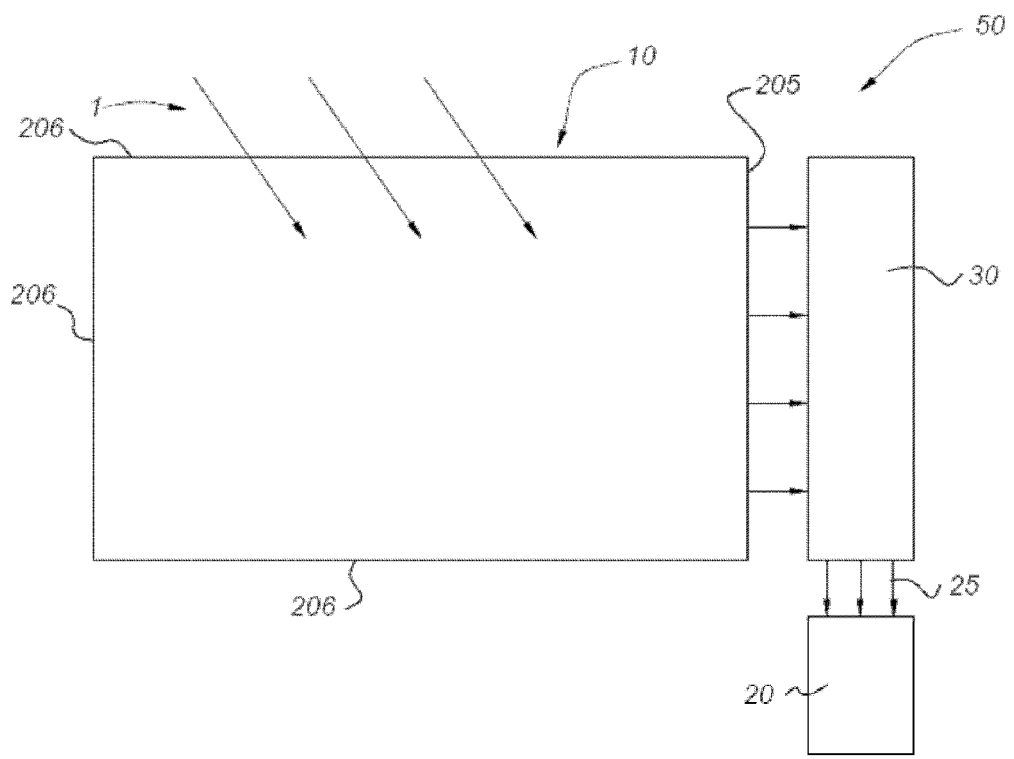

FIG. 24a and FIG. 24b schematically show embodiments of solar cell systems 50 according to the invention.

FIG. 24a shows a cross-sectional view of a solar cell system 50 comprising a luminescent optical device 10 according to the invention and a PV cell 20. The luminescent optical device 10 has an optical exit surface 205, preferably at an edge of the waveguide 200, whereby emission light that has propagated through the waveguide 200 can escape from the waveguide 200. The PV cell 20 comprises an entrance surface 25, which may also be referred to as a light receiving surface 25, arranged to receive the emission light escaping from the waveguide 200. The PV cell 25 then, during use, converts the received emission light into electrical energy. The PV cell 25 is preferably arranged at one or more edges of the waveguide, or near one or more edges of the waveguide on the top or bottom surface of the waveguide layer. The optical exit surface 205 and the light receiving surface 25 may be in direct contact, or be positioned at a small distance or attached via an attachment layer, preferably with a refractive index intermediate between the refractive index of the waveguide and that of the PV cell.

FIG. 24b shows a top-view of an alternative embodiment of a solar cell system 50 according to the invention. The solar cell system 50 of FIG. 24b differs from that of FIG. 23a in that it further comprises a light collection waveguide 30. The light collection waveguide 30 is arranged to receive emission light escaping from an optical exit surface 205, which may in this embodiment correspond to the full length of one or more edges of the waveguide 200, and to transport this emission light to the light-receiving surface 25 of the PV cell 20. The light collection waveguide 30 may comprise a further luminescent structure, arranged to covert the emission light into optical radiation of again another wavelength range, and transport thus optical radiation to the PV cell 25. The further luminescent structure may e.g. arranged emit radiation in a wavelength range optimized for conversion into electrical energy by the PV cell 25.

Radiation losses from the luminescent optical device may be further minimised by applying mirrors or scatterers to the sides 206 of the luminescent optical device that are not supposed to transmit emission light to e.g. a photovoltaic device, as indicated with side 206 in FIG. 24a and FIG. 24b. Accordingly, in a preferred embodiment at least one of the sides of the luminescent optical device is covered with a mirror or scatterer that is at least 80% reflective for wavelengths of 450-1200 nm, preferably at least 90% reflective for wavelengths 350-1200 nm. More preferably at least two sides and most preferably at least three sides of the object are covered with such a mirror.

The different embodiments of luminescent optical devices 10 according to the invention may be manufactured of possible manufacturing methods. Some exemplary methods for manufacturing lenses 310, luminescent domains 110, and complete luminescent optical devices 10 are described below. It will be appreciated that some manufacturing methods are only usable for specific embodiments. Some of the methods can advantageously be applied in a roll-to-roll manner. Some of the methods can advantageously manufacture the lens structure and the waveguide independently, and use lamination (e.g. with an adhesive, or thermal lamination) of e.g. the lens structure to the waveguide.

The waveguide may be made of plastic, of glass or of a laminate of plastic and glass. The waveguide may be flat or alternatively have some surface structuring for better architectural integration (such as 'waves' for European tiles roofs). The waveguide may be 10 μm to 2 cm thick, and may be 1 to 100 cm in length and width. The waveguide could be flexible, and the luminescent optical device 10 as a whole could be flexible.

Manufacturing of the Lens Structure with Plurality of Lenses

The lenses 310 are preferably polymeric lenses.

The lenses 310 may e.g. be produced using injection moulding of individual lenses, which are thereafter applied on a transparent substrate for forming the lens structure 300, which is then applied on the optical waveguide 200. The lenses may alternatively be produced as e.g. a sheet of lenses using injection moulding of a complete lens structure 310 which accommodates the lenses 310 connected together and thus forming the lens structure as a structured optical foil, which may then be laminated onto the optical waveguide.

The lenses may alternatively be produced using standard embossing techniques, for producing individual lenses or the complete lens structure, e.g. as a structured optical foil.

The lens structure with the lenses may alternatively be produced using photoembossing, as described in literature, for example, as in Fakhfouri, V.; Cantale, N.; Mermoud, G.; Kim, J. Y.; Boiko, D.; Charbon, E.; Martinoli, A.; Brugger, J. *Inkjet printing of SU-8 for polymer-based MEMS a case study*

*for microlenses*, IEEE International Conference on Micro Electro Mechanical Systems, Technical Digest, 21st, Tucson, Ariz., United States, Jan. 13-17, 2008. Contactless photoembossing may e.g. be used to spontaneously form microscale lenses. Photoembossing may especially be advantageous for lenses smaller than 0.5 mm lens diameter, for large-area applications, or in situations that minimal material use is desired. Photoembossing may also be advantageous for contactless, spontaneous lens formation.

The lens structure 300 may further be provided with additional optical layers and/or an adhesive for attaching the lens structure 300 to the waveguide 200. The additional optical layers may e.g. comprise one or more low-refractive index layers and/or one or more wavelength-selective mirror layers.

The lenses could be substantially circular and e.g. packed in a square or hexagonal arrangement, or be substantially cylindrical and e.g. arranged side-by-side. The lenses are preferably aspherical lenses, i.e. have an aspherical cross section perpendicular to the waveguide surface in at least one direction.

Manufacturing of the Luminescent Structure with Plurality of Luminescent Domains with Luminescent Material Any luminescent material can be used that absorbs in the wavelength range of the incident light with which it is to be used, i.e. in particular in the wavelength range of sun light. Preferably, the luminescent material should also have one or more of the following characteristics:

- the luminescent material preferably has a high quantum efficiency for conversion of the absorbed light (excitation light) into emission light,
- the luminescent material preferably has as large Stokes shift in emission, to further reduce the effect of re-absorption and/or to obtain emission light that can be efficiently converted into electrical energy using a photovoltaic cell, and
- the luminescent material preferably has a high degree of photostability, to maintain its luminescent performance as long as possible.

The luminescent material may e.g. a dye absorbing within the range of 350-1000 nm and with an emission close to 1100 nm. Some commercially available dyes suitable for this are BASF Lumogen Red305, Yellow083, Orange240 and Violet570. Alternatively, quantum dots or rods may be used as luminescent material, or phosphors.

The luminescent material may be arranged to isotropically emit emission light into substantially all directions into the waveguide. The luminescent material may alternatively be arranged to emit its emission light within a pre-determined orientation into the waveguide. The luminescent domains may e.g. comprise an aligned polymer that contains an oriented photoluminescent material, wherein the aligned polymer has a 0° pretilt angle, or a pretilt angle of 10-85° relative to the surface of the waveguide and the oriented photoluminescent material is immobilized within the aligned polymer matrix, allowing to couple optical radiation emitted by the luminescent material into the waveguide, as is described in EP 1 854 151.

The luminescent domains 110 may be produced by inkjet printing of the luminescent structure 100 with the luminescent domains 110 on an external surface of the waveguide 200, or into embossments in the external surface of the waveguide.

The luminescent domains 110 may alternatively be produced using photolithography of e.g. mix of a dye and a photosensitive host applied on the external surface of the waveguide 200, e.g. by UV illumination through a mask, followed by flushing with solvent to etch away the uncrosslinked host/dye mix.

Figure 25A:
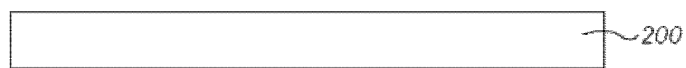
FIG. 25a-FIG. 25e schematically illustrate a method of manufacturing a luminescent optical device according to the invention.
Figure 25B:
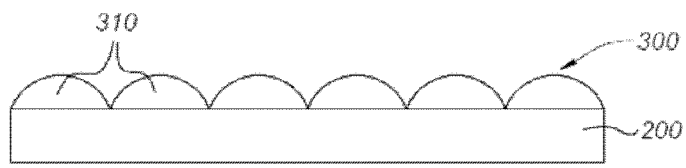
Figure 25C:
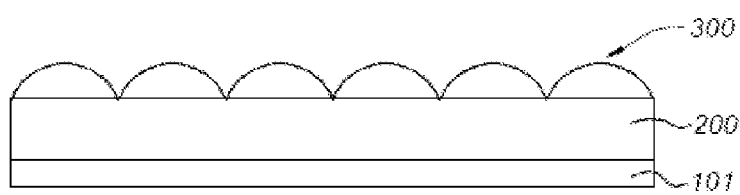
Figure 25D:
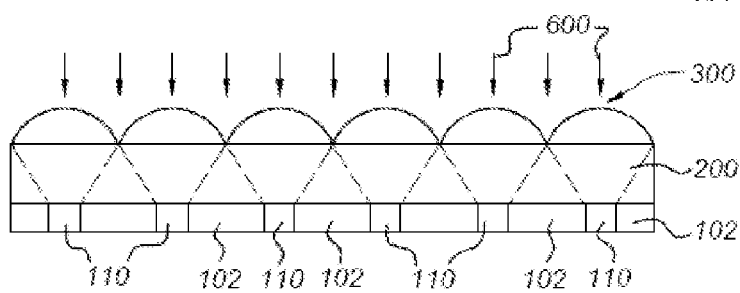
Figure 25E:
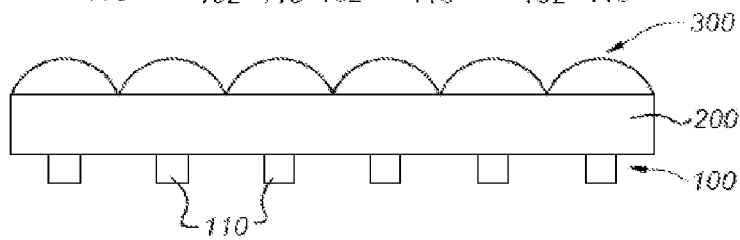
Figure 25F:
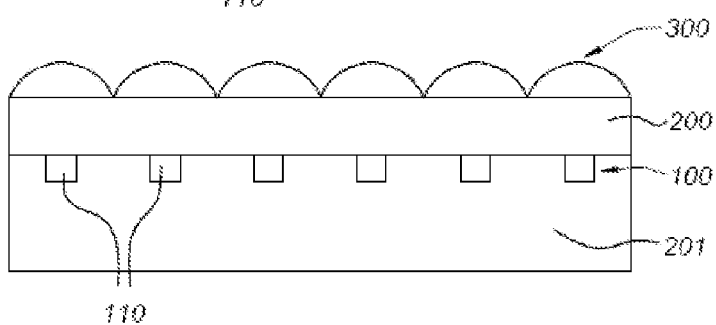
FIG. 25f schematically illustrates a further method of manufacturing a luminescent optical device according to the invention.

The luminescent domains 110 may alternatively be produced using illumination through the lenses 310 themselves to crosslink a guest/host matrix of luminescent material and a host material, as is schematically illustrated in FIG. 25a-FIG. 25e. The method starts with providing an optical waveguide 200, as shown in FIG. 25a. A lens structure 300 is then applied on the waveguide 200, as shown in FIG. 25b. The lens structure 300 may be produced independently from the waveguide 200, e.g. on a carrier material by e.g. embossing mm- to cm-diameter lenses 310, and then be attached to the waveguide 200. The lens structure 300 may alternatively be created on the waveguide by e.g. contactless photoembossing to spontaneously form microscale lenses. The waveguide 200 provided with the lens structure 300 is then coated with a thin layer 101 of luminescent material in a photoactive carrier material, as shown in FIG. 25c. Next, illumination through the lens structure 300 and the waveguide 200 with illumination light 600 focuses the light onto the photoactive carrier material comprising the luminescent material, and causes cross-linking of the photoactive carrier material only in the focused areas, as is shown in FIG. 25d. The unreacted photoactive carrier material 102 is then washed away, leaving the desired pattern of luminescent domains 110 with luminescent material on the bottom surface of the waveguide 200.

The method may be especially advantageous when the luminescent optical device has a large plurality of small lenses 31 and a corresponding large plurality of small luminescent domains 110 which have to be aligned. When such large pluralities would have been independently produced, physical alignment may be very difficult, whereas the method according to the invention provides well-aligned luminescent domains 110, wherein the method may even provide robustness against differences between individual lenses, as e.g. a side-wise shift of the focal point of an individual lens will result in a corresponding side-wise shift of the corresponding luminescent domain. Moreover, the method may be applied in a roll-to-roll method, allowing a potentially economical large-scale manufacturing.

The method shown in FIG. 25a-25e allows manufacturing e.g. the luminescent optical device 10 shown in FIG. 21a, with the luminescent domains 110 at the bottom surface of the waveguide. When the luminescent optical device 10 shown in FIG. 21c has to be manufactured, the method may continue by adding a second optical waveguide 201 on the waveguide 200 provided with the luminescent domains 110, thereby extending the waveguide 200 to embed the luminescent domains.

When the luminescent optical device 10 shown in FIG. 21d has to be manufactured, the method starts with the lens structure 300 which is then coated with a thin layer 101 of luminescent material in a photoactive carrier material on its bottom surface. This thin layer 101 may also be referred to as a photo-curable layer. Next, illumination through the lens structure 300 with illumination light 600 focuses the light onto the photoactive carrier material comprising the luminescent material, and causes cross-linking of the photoactive carrier material only in the focused areas, so as create exposed photocured luminescent domains in a non-photocured environment of unreacted photoactive carrier material 102. The unreacted photoactive carrier material 102 is then washed away, leaving the exposed photocured luminescent domains as the desired pattern of luminescent domains 110 with luminescent material on the bottom surface of the lens structure 300. Next, a waveguide 200 is applied on the bottom surface of the lens structure 300, whereby the luminescent domains 110 are included in between the lens structure 300 and the waveguide 200, as shown in FIG. 21d.

When the luminescent optical device 10 shown in FIG. 21b has to be manufactured, embossed pits have to be manufactured which are aligned relative to the lenses. This may be achieved using a similar method as described above, but instead of applying a thin layer 101 of luminescent material in a photoactive carrier material, as shown in FIG. 25c, a thin layer 101 of a photoresist may be applied, which is illuminated through the lens structure 300 with illumination light 600, which focuses the illumination light onto the photoresist and thus exposes the photoresist in aligned positions relative to the lenses 310. The photoresist is then developed, whereby the unexposed photoresist forms an optically transparent layer with holes at the positions where the photoresist was exposed, thus forming the embossed pits in a newly-formed waveguide (formed by the waveguide 200 and the optically transparent layer with the holes). Alternatively, the unexposed photoresist may form an etch-stop layer, and etching may be used to etch the holes in the waveguide 200 at the positions where the exposed photoresist was present. Next, the holes may be filled with luminescent material for forming the luminescent domains 110, e.g. by printing luminescent material into the holes, or by doctor-blading luminescent material into the holes.

In the drawings, less relevant features like electrical cables, etc. have not been drawn for the sake of clarity.

The term "substantially" herein, such as in "substantially flat" or in "substantially consists", etc., will be understood by the person skilled in the art. In embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The term "and/or" includes any and all combinations of one or more of the associated listed items. The article "a" or "an" preceding an element does not exclude the presence of a plurality of such elements. The article "the" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A luminescent optical device having a first surface and a second surface opposite the first surface, wherein the first surface and second surfaces are orthogonal to a surface receiving incident light, comprising:
    an optical waveguide,
    a photo-luminescent structure on or in the optical waveguide comprising a plurality of photo-luminescent domains disposed adjacent each other in a longitudinal plane of the optical waveguide that extends along the optical waveguide from the first surface to the second surface, each photo-luminescent domain containing photo-luminescent material, wherein the concentration and/or thickness of the photo-luminescent material within two adjacent photo-luminescent domains is varied with respect to each other in the longitudinal plane of the optical waveguide so as to produce differences in colors or intensity along the longitudinal plane of the optical waveguide, the photo-luminescent material being capable of emitting emission light upon excitation by excitation light, and
    the photo-luminescent domains being arranged to emit, upon excitation by excitation light, at least part of the emission light into the optical waveguide,
    a photovoltaic cell disposed on the first surface or the second surface, wherein the photovoltaic cell is arranged to receive emission light from the optical waveguide.

2. The luminescent optical device according to claim 1 wherein the concentration of the photo-luminescent material is varied by offset printing, flexoprinting, or painting.

3. The luminescent optical device according to claim 1 wherein the photo-luminescent domains are provided at an external surface of the optical waveguide and/or the photo-luminescent domains are embedded in the optical waveguide.

4. The luminescent optical device according to claim 1 wherein the photo-luminescent material is present in a film on top of the optical waveguide.

5. The luminescent optical device according to claim 1 wherein the optical waveguide is a flat plate waveguide with geometrical alterations to the flat plate to promote local out-coupling of the light.

6. The luminescent optical device according to claim 1 wherein the photo-luminescent domains have a smallest width in the range of 1 μm to 1 cm.

7. The luminescent optical device according to claim 1 wherein the electrical energy generated by the photovoltaic cell is stored in electrical energy storage.

8. The luminescent optical device according to claim 1 wherein the electrical energy generated by the photovoltaic cell is used for illumination of the luminescent pattern on or in the optical waveguide.

9. The luminescent optical device according to claim 1 forming a component of a sign.

10. The luminescent optical device according to claim 1 adapted for concentrating incident light provided from an external light source.

11. A solar cell system comprising a luminescent optical device according to claim 1 wherein the optical waveguide comprises an optical exit surface arranged to allow at least part of the emission light to escape from the optical waveguide, and the photovoltaic cell comprises a light receiving surface, wherein the light receiving surface is arranged to receive emission light escaping from the optical waveguide by the optical exit surface.

12. The solar cell system according to claim 11 adapted for providing electrical energy from the photovoltaic cell.

* * * * *